(12) United States Patent
Su et al.

(10) Patent No.: US 12,148,795 B2
(45) Date of Patent: Nov. 19, 2024

(54) INCREASING DEVICE DENSITY AND REDUCING CROSS-TALK SPACER STRUCTURES

(71) Applicant: Taiwan Semiconductor Manufacturing Company, Ltd., Hsin-Chu (TW)

(72) Inventors: Huan-Chieh Su, Tianzhong Township (TW); Chia-Hao Chang, Hsinchu (TW); Cheng-Chi Chuang, New Taipei (TW); Chih-Hao Wang, Baoshan Township (TW); Yu-Ming Lin, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 33 days.

(21) Appl. No.: 17/868,834

(22) Filed: Jul. 20, 2022

(65) Prior Publication Data
US 2022/0359649 A1 Nov. 10, 2022

Related U.S. Application Data

(62) Division of application No. 16/916,466, filed on Jun. 30, 2020, now Pat. No. 11,527,609.
(Continued)

(51) Int. Cl.
*H01L 29/06* (2006.01)
*H01L 21/8238* (2006.01)
*H01L 27/092* (2006.01)
*H01L 27/118* (2006.01)

(52) U.S. Cl.
CPC .. *H01L 29/0649* (2013.01); *H01L 21/823821* (2013.01); *H01L 27/0924* (2013.01);
(Continued)

(58) Field of Classification Search
CPC ............... H01L 29/0649; H01L 29/165; H01L 29/0653; H01L 29/0847; H01L 29/66439;
(Continued)

(56) References Cited

U.S. PATENT DOCUMENTS 7,799,682 B2 * 9/2010 Beyer ............... H01L 21/76877
257/757
9,559,184 B2 * 1/2017 Ching ................... H01L 29/785
(Continued)

OTHER PUBLICATIONS

Notice of Allowance dated Sep. 19, 2022 for U.S. Appl. No. 16/916,466.
(Continued)

*Primary Examiner* — Dao H Nguyen
(74) *Attorney, Agent, or Firm* — Eschweiler & Potashnik, LLC

(57) ABSTRACT

In some embodiments, the present disclosure relates to an integrated chip including a first transistor and a second transistor arranged over a substrate. The first transistor includes first and second source/drain regions over the substrate and includes a first channel structure directly between the first and second source/drain regions. A first gate electrode is arranged over the first channel structure and is between first and second air spacer structures. The second transistor includes third and fourth source/drain regions over the substrate and includes a second channel structure directly between the third and fourth source/drain regions. A second gate electrode is arranged over the second channel structure and is between third and fourth air spacer structures. The integrated chip further includes a high-k dielectric spacer structure over a low-k dielectric fin structure between the first and second channel structures to separate the first and second gate electrodes.

20 Claims, 24 Drawing Sheets

Related U.S. Application Data

(60) Provisional application No. 62/928,534, filed on Oct. 31, 2019.

(52) U.S. Cl.
CPC .............. *H01L 27/11807* (2013.01); *H01L 2027/11831* (2013.01); *H01L 2027/11892* (2013.01)

(58) Field of Classification Search
CPC ............ H01L 29/0673; H01L 29/1079; H01L 29/775; H01L 21/823821; H01L 21/823431; H01L 27/0924; H01L 27/11807; H01L 2027/11831; H01L 2027/11892
See application file for complete search history.

(56) References Cited

U.S. PATENT DOCUMENTS

| | | | |
|---|---|---|---|
| 10,062,764 B1 | 8/2018 | Wu et al. | |
| 2014/0138779 A1* | 5/2014 | Xie | H01L 29/66553 257/401 |
| 2016/0163816 A1* | 6/2016 | Yu | H01L 29/6653 438/283 |
| 2016/0365426 A1* | 12/2016 | Ching | H01L 29/6653 |
| 2017/0084714 A1 | 3/2017 | Ching et al. | |
| 2018/0090593 A1* | 3/2018 | Cheng | H01L 21/7682 |
| 2018/0277665 A1* | 9/2018 | Chen | H01L 29/0673 |
| 2019/0355721 A1 | 11/2019 | Jambunathan et al. | |
| 2019/0378909 A1 | 12/2019 | Cheng et al. | |
| 2020/0219989 A1* | 7/2020 | Cheng | H01L 29/6656 |
| 2020/0388694 A1* | 12/2020 | Cheng | H01L 29/6653 |

OTHER PUBLICATIONS

U.S. Appl. No. 16/550,049, filed Aug. 23, 2019.
U.S. Appl. No. 16/785,985, filed Feb. 10, 2020.
U.S. Appl. No. 16/929,592, filed Jul. 15, 2020.
Non-Final Office Action dated Apr. 27, 2022 for U.S. Appl. No. 16/916,466.

\* cited by examiner

INCREASING DEVICE DENSITY AND REDUCING CROSS-TALK SPACER STRUCTURES

REFERENCE TO RELATED APPLICATIONS

This Application is a Divisional of U.S. application Ser. No. 16/916,466, filed on Jun. 30, 2020, which claims the benefit of U.S. Provisional Application No. 62/928,534, filed on Oct. 31, 2019. The contents of the above-referenced patent applications are hereby incorporated by reference in their entirety.

BACKGROUND

The semiconductor industry continues to improve the integration density of various electronic devices (e.g., transistors, diodes, resistors, capacitors, etc.) by, for example, reducing minimum feature sizes and/or arranged electronic devices closer to one another, which allows more components to be integrated into a given area. For example, in an integrated chip may comprise multiple transistor devices, isolated from one another by isolation structures (e.g., interlayer dielectric structures, shallow trench isolation structures, etc.). To arrange the multiple transistor devices closer to one another, the isolation structures must be effective enough to mitigate leakage and cross-talk amongst the multiple transistor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
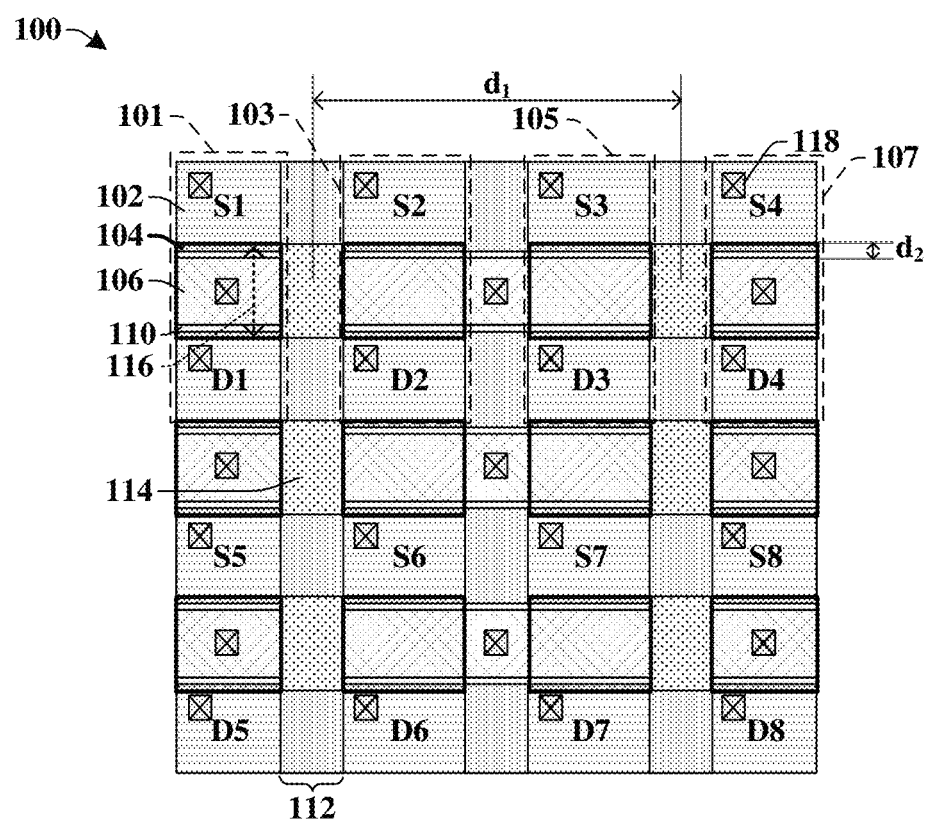
FIG. 1 illustrates a layout view of some embodiments of an integrated chip comprising multiple transistors having air spacer structures within each transistor and high-k dielectric spacer structures between transistors to increase transistor density on a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit may comprise, in some embodiments, multiple transistor devices arranged over a same substrate. In some configurations, each transistor device is isolated from one another. In some other configurations, for example, in a complementary metal oxide semiconductor (CMOS) device, two transistor devices are intentionally coupled together. In some such configurations, for example, if a first CMOS device is arranged beside a second CMOS device, the first CMOS device may be isolated from the second CMOS device such that the first and second CMOS devices may operate independently from one another. Thus, one or more isolation structures may be arranged between the first and second CMOS devices to prevent cross-talk and leakage between the two devices.

Various embodiments of the present disclosure are directed towards an integrated chip comprising multiple transistors having air spacer structures surrounding gate electrodes and high-k dielectric spacer structures between devices to reduce spacing between the transistor devices while preventing cross-talk and leakage. The high-k dielectric spacer structures may comprise a dielectric material that has a dielectric constant greater than 7. The air spacer structures may reduce capacitance and/or within each transistor, and the high-k dielectric spacer structures may reduce spacing between transistors. In some embodiments, the multiple transistors may be, for example, fin field effect transistors (finFETs), nanosheet field effect transistors (NS-FETs), or some other transistor structure.

FIG. 1 illustrates a layout view 100 of some embodiments of an integrated chip comprising multiple transistors that are arranged closely to one another but isolated enough to be operated independently.

The layout view 100 includes many source/drain regions 102, such as for example, first through eighth source regions S1-S8 and first through eighth drain regions D1-D8, and thus, in some embodiments, the integrated chip may comprise at least eight transistors. Further, in some embodiments, the transistors may share some source/drain regions 102 with one another. For example, in some embodiments, the first drain region D1 and the fifth source region S5 may be a part of a same transistor. Thus, in some embodiments, the layout view 100 of FIG. 1 comprises 12 transistors. It will be appreciated that other configurations, numbers and/or or types of transistors than depicted in the layout view 100 are also within the scope of the disclosure.

Further, in some embodiments, a first transistor 101 may comprise the first source region S1 and the first drain region D1. A channel structure 104 is arranged directly between the first source region S1 and the first drain region D1, and a gate electrode 106 is arranged over the channel structure 104. Further, in some embodiments, air spacer structures 110 may surround outer sidewalls of the gate electrode 106. Voltage sources may be coupled to the first source region S1, the first drain region D1, and the gate electrode 106 through contact vias 118. Thus, during operation, when a voltage bias greater than a threshold voltage of the first transistor 101 is applied to the first transistor 101, the first transistor 101 is turned "ON," and mobile charge carriers may travel between the first source region S1 and the first drain region D1 as illustrated by a dotted arrow 116. The air spacer structures 110 of the first transistor 101 mitigate capacitance between the gate electrode 106 the contact vias 118 on the first source and drain regions S1, D1. Thus, the air spacer structures 110 reduce a second distance $d_2$ between the source/drain regions 102 and the gate electrode 106 of the first transistor 101 while maintaining or improving performance of the first transistor 101. For example, in some embodiments, the speed of the transistors (e.g., 101, 103, 105, 107) may be increased by 4 to 6 percent due to the air spacer structures 110.

In some embodiments, the first transistor 101, a second transistor 103, a third transistor 105, and a fourth transistor 107 are arranged beside one another. Dielectric fin structures 112 may be arranged between the first, second, third, and fourth transistors 101, 103, 105, 107. In some embodiments, during manufacturing, the gate electrodes 106 over the first, second, third, and fourth transistors 101, 103, 105, 107 have topmost surfaces that are above the dielectric fin structures 112.

In some embodiments, the gate electrode 106 of the second transistor 103 and the gate electrode 106 of the third transistor 105 may be coupled to one another. For example, in some embodiments, the second and third transistors 103, 105 may together form a complementary metal oxide semiconductor (CMOS) device such as a CMOS invertor. In such embodiments, the second and third transistors 103, 105 may have different threshold voltages than one another. In such embodiments, the gate electrode 106 of the second transistor 103 may extend over the dielectric fin structure 112 that is arranged between the second and third transistors 103, 105 to contact the gate electrode 106 of the third transistor 105. Contrarily, in some embodiments, isolation between the first transistor 101 and the second transistor 103 may be desired. In such embodiments, a high-k dielectric spacer structure 114 may be arranged directly over the dielectric fin structure 112 that is arranged between the channel structures 104 of the first and second transistors 101, 103. The high-k dielectric spacer structure 114 has a topmost surface that is above a topmost surface of the gate electrodes 106 of the first and second transistors 101, 103, thereby providing isolation between the gate electrode 106 of the first transistor 101 and the gate electrode 106 of the second transistor 103. Similarly, in some embodiments, isolation between the third transistor 105 and the fourth transistor 107 may also be desired. In such embodiments, a high-k dielectric spacer structure 114 may also be arranged directly over the dielectric fin structure 112 that is arranged between the channel structures 104 of the third and fourth transistors 105, 107. It will be appreciated that other designs of the layout view 100 of FIG. 1 are also within the scope of this disclosure. For example, in some embodiments, a high-k dielectric spacer structure 114 may also be arranged between the second and third transistors 103, 105.

Because of the dielectric fin structures 112 and the high-k dielectric spacer structures 114, the transistors (e.g., 101, 103, 105, 107) may be arranged closer to one another. For example, in such embodiments, the spacing of a CMOS device comprising the second and third transistors 103, 105 as defined by the high-k dielectric spacer structures 114 may be indicated by a first distance $d_1$. In such embodiments, the first distance $d_1$ may be reduced due to isolation provided by the dielectric fin structures 112 and the high-k dielectric spacer structures 114, thereby increasing the density of transistors (e.g., 101, 103, 105, 107) on the integrated chip.

Figure 2:
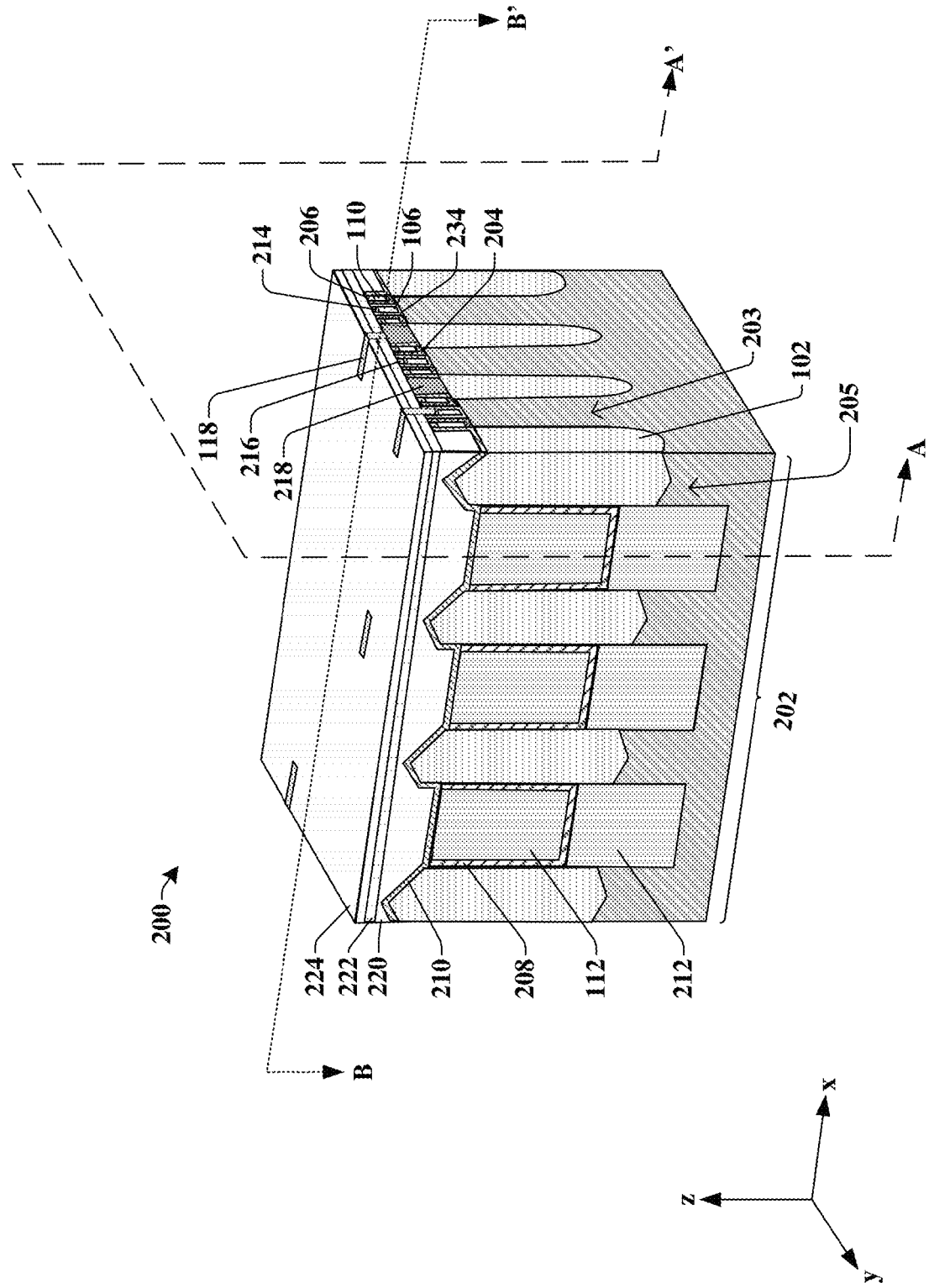
FIGS. 2-4 illustrate various views of some embodiments of an integrated chip comprising fin field effect transistors corresponding to the layout schematic of FIG. 1.

FIG. 2 illustrates a perspective view 200 of some embodiments of an integrated chip comprising multiple fin field effect transistors (finFETs) arranged over a same substrate.

In some embodiments, the transistors (e.g., 101, 103, 105, 107) illustrated in FIG. 1 may correspond to finFETs. As illustrated in the perspective view 200 of FIG. 2, in such embodiments, the finFETs may comprise semiconductor fin structures 203 protruding in a z-direction from a substrate 202. The semiconductor fin structures 203 may correspond to the channel structures (104 of FIG. 1). In some embodiments, the semiconductor fin structures 203 are arranged directly between the source/drain regions 102 in a y-direction, and the gate electrodes 106 are arranged over the semiconductor fin structures 203. In some embodiments, sub-semiconductor fins 205 that do not act as channel structures may be present on an xz-plane, and lower isolation structures 212 are arranged between the sub-semiconductor fins 205. In some embodiments, the dielectric fin structures 112 are arranged over the lower isolation structures 212, and extend in the y-direction to provide isolation between the finFETs, as described in FIG. 1. In some embodiments, a dielectric fin liner 208 is arranged between the source/drain regions 102 and the dielectric fin structures 112, and the dielectric fin liner 208 may also be arranged between the lower isolation structures 212 and the dielectric fin structures 112. In some embodiments, a low-k dielectric layer 210 is arranged over the source/drain regions 102 and the dielectric fin structures 112. Further, in some embodiments, an upper isolation structure 220 may be arranged over the source/drain regions 102 and the dielectric fin structures 112, and a topmost isolation layer 224 over a topmost etch stop layer 222 may be arranged over the upper isolation structure 220. In some embodiments, the low-k dielectric layer 210 may comprise a low-k dielectric material with a dielectric constant less than 7, whereas the high-k dielectric spacer structure (114 of FIG. 1) comprises a high-k dielectric material with a dielectric constant greater than 7.

In some embodiments, on a yz-plane, each gate electrode 106 may have a bottom surface and sidewalls surrounded by a high-k dielectric layer 234. Further, the air spacer structures 110 may be arranged directly over the semiconductor fin structure 203 and along the sidewalls of the gate electrode 106. In some embodiments, low-k dielectric spacer structures 204 may be arranged over the semiconductor fin structure 203 and between the high-k dielectric layer 234 and the air spacer structures 110. In some embodiments, the low-k dielectric spacer structures 204 exhibit an "L-like" shape. In some embodiments, a sealing structure 206 defines a top surface of each air spacer structure 110. Further, in some embodiments, an upper conductive layer 214 may be arranged over the gate electrode 106, and in some embodiments, a filler layer 216 may be arranged over the upper conductive layer 214. In some embodiments, the filler layer 216 comprises, for example, silicon oxide, hafnium silicon, silicon oxygen carbide, zirconium silicon, tantalum carbon nitride, silicon nitride, silicon oxygen carbon nitride, silicon, zirconium nitride, or silicon carbon nitride. In some embodiments, a contact via 118 may be arranged over the upper conductive layer 214 and thus, coupled to the gate electrode 106. Further, in some embodiments, a metal wire 218 is arranged over at least some of the source/drain regions 102. In some embodiments, the contact vias 118 are coupled to the source/drain regions 102 through the metal wires 218.

Figure 3:
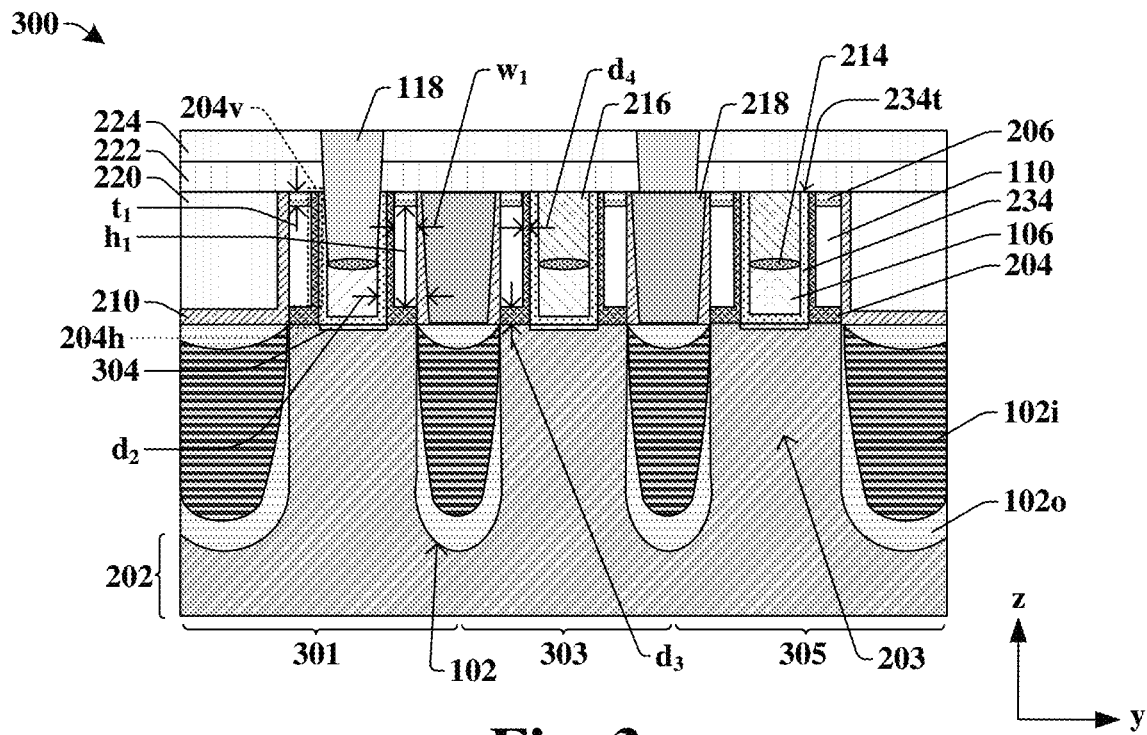
Figure 4:
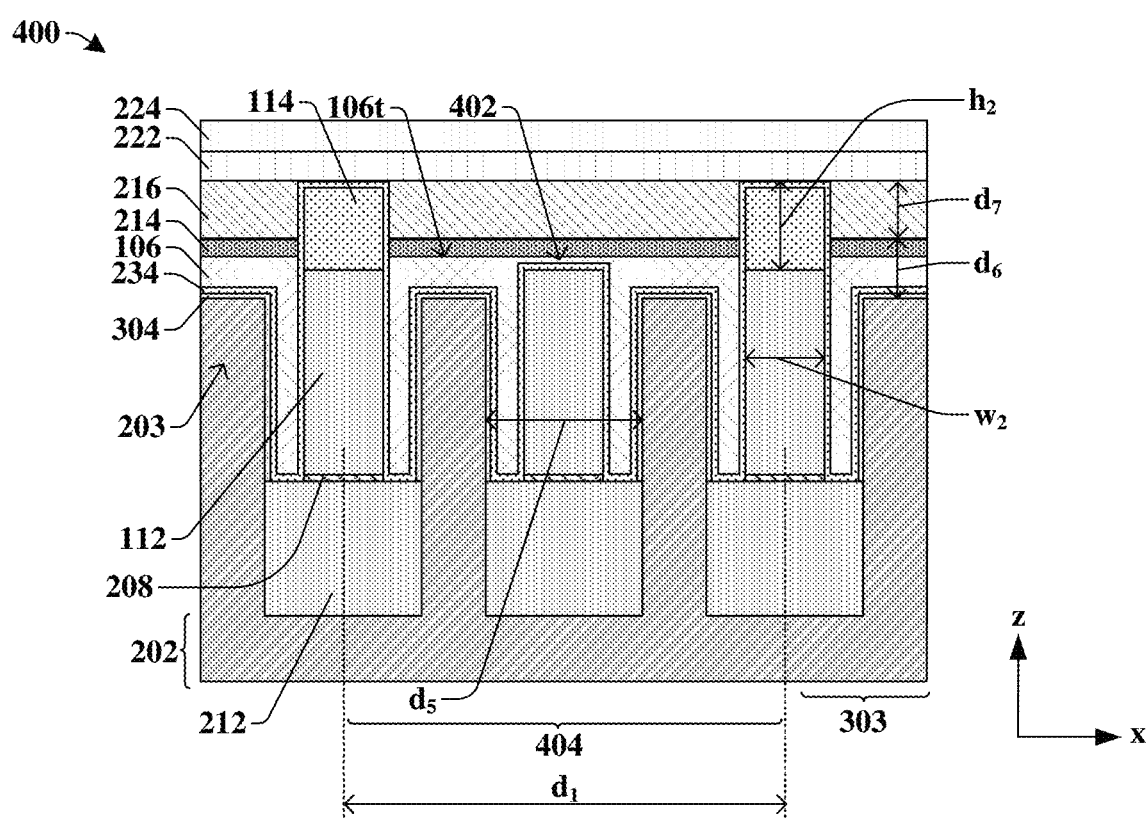

More details of the features of the perspective view 200 of FIG. 2 that promote a high finFET density on the substrate 202 and that improve performance of the overall integrated chip are described in cross-sectional views 300 and 400 of FIGS. 3 and 4.

FIG. 3 illustrates a cross-sectional view 300 of some embodiments of the integrated chip comprising multiple finFETs from the yz-plane of FIG. 2. Thus, in some embodiments, the cross-sectional view 300 may correspond to cross-section line AA' of FIG. 2.

The cross-sectional view 300 of FIG. 3 includes a second finFET 303 arranged between a first finFET 301 and a third finFET 305 in the y-direction. In some embodiments, the source/drain regions 102 may be shared amongst the first, second, and third finFETs 301, 303, 305. For example, in some embodiments, the second finFET 303 shares its source/drain regions 102 with the first and third finFETs 301, 305. In some embodiments, the source/drain regions 102 include an inner portion 102i. In such embodiments, the inner portion 102i may have a different doping concentration than an outer portion 102o of the source/drain regions 102. For example, in some embodiments, the source/drain regions 102 comprise silicon germanium, and the outer portions 102o have a higher concentration of germanium than the inner portions 102i. In some embodiments, metal wires 218 are arranged over the source/drain regions 102. In some embodiments, contact vias 118 extend through the topmost etch stop layer 222 and the topmost isolation layer 224 to contact the metal wires 218 over the source/drain regions 102.

In some embodiments, the gate electrode 106 is arranged over the semiconductor fin structure 203. In some embodiments, a high-k dielectric layer 234 is arranged directly on outer sidewalls of the gate electrode 106, and an interfacial layer 304 is arranged directly between the high-k dielectric layer 234 and the semiconductor fin structure 203. In some other embodiments, the interfacial layer 304 may also be arranged on outer sidewalls of the high-k dielectric layer 234. Further, in some embodiments, the high-k dielectric layer 234 has topmost surfaces 234t arranged above topmost surfaces of the gate electrode 106. Further, in some embodiments, the upper conductive layer 214 is arranged over the gate electrode 106, and the high-k dielectric layer 234 surrounds outermost sidewalls of the upper conductive layer 214. In some embodiments, a contact via 118 extends through the topmost etch stop layer 222 and the topmost isolation layer 224 to contact the upper conductive layer 214 and thus, be coupled to the gate electrode 106.

Because the topmost surfaces 234t of the high-k dielectric layer 234 are above the gate electrode 106, there is more space for the contact via 118 to land on the gate electrode 106 during manufacturing without interfering with the air spacer structures 110. Further, the high-k dielectric layer 234 mitigates electrical leakage away from the contact via 118 and the gate electrode 106. In some embodiments, the high-k dielectric layer 234 comprises a high-k dielectric material, wherein the dielectric constant is greater than 7, such as, for example, hafnium oxide, zirconium oxide, hafnium aluminum oxide, hafnium silicon oxide, aluminum oxide, or some other suitable high-k dielectric material. Similarly, the low-k dielectric layer 210 acts as a structural barrier during between the metal wires 218 and the air spacer structures 110, in some embodiments. In some embodiments, the filler layer 216 is arranged on portions of the gate electrode 106 that are not in contact with the contact via 118.

During operation of the first finFET 301, for example, isolation between the contact via 118 over the gate electrode 106 and the metal wires 218 over the source/drain regions 102 and/or isolation between the metal wires 218 over the source/drain regions 102 and the gate electrode 106 is important to reliably control voltages applied to the source/drain regions 102 and to the gate electrode 106. Thus, in some embodiments, the gate electrode 106 is laterally surrounded by the high-k dielectric layer 234, low-k dielectric spacer structures 204, air spacer structures 110, and the low-k dielectric layer 210 to reduce capacitance and increase device reliability. Further, in some embodiments, the air spacer structures 110 reduce the second distance $d_2$ between the gate electrode 106 and adjacent metal wire 218 of the first finFET 301.

In some embodiments, the low-k dielectric spacer structures 204 are arranged along outer sidewalls of the high-k dielectric layer 234 and over the semiconductor fin structure 203. In such embodiments, the low-k dielectric spacer structure 204 has an overall "L-like" shape, wherein a vertical portion 204v of the low-k dielectric spacer structure 204 is arranged directly on an outermost sidewall of the high-k dielectric layer 234, and wherein a horizontal portion 204h is connected to the vertical portion 204v and is arranged directly on the semiconductor fin structure 203. In some embodiments, the horizontal portion 204h has a thickness equal to a third distance $d_3$ that is measured in the z-direction between a bottommost surface and a middle surface of the low-k dielectric spacer structure 204. In some embodiments, the vertical portion 204v has a thickness equal to a fourth distance $d_4$ measured in the y-direction between a middle sidewall and a first outermost sidewall of the low-k dielectric spacer structure 204, wherein the y-direction is perpendicular to the z-direction. In some embodiments, the third distance $d_3$ is greater than the fourth distance $d_4$. In some embodiments the third distance $d_3$ and the fourth distance $d_4$ may be in a range of between approximately 0.1 nanometers and approximately 4 nanometers, for example. In some embodiments, the low-k dielectric spacer structure 204, as well as the low-k dielectric layer 210, may each comprise a low-k dielectric material, wherein the dielectric constant is less than 7, such as, for example, silicon oxynitride, silicon carbon nitride, silicon oxygen carbide, silicon oxygen carbon nitride, silicon nitride, or some other suitable low-k dielectric material.

In some embodiments, the middle surface and the middle sidewall of the low-k dielectric spacer structure 204 defines surfaces of the air spacer structure 110. In some embodiments, the air spacer structure 110 is arranged between and has outer sidewalls defined by the low-k dielectric spacer structure 204 and the low-k dielectric layer 210. The air spacer structure 110 extends above the gate electrode 106 and surrounds portions of the contact via 118 arranged over the gate electrode 106. A sealing structure 206 is arranged over and defines a top surface of the air spacer structure 110. The air spacer structure 110 has a first height $h_1$ measured in the z-direction and a first width $w_1$ measured in the y-direction. In some embodiments, the first height $h_1$ may be in a range of between, for example, approximately 4 nanometers and approximately 10 nanometers., and the first width $w_1$ may be in a range of between, for example, approximately 0.5 nanometers and approximately 6 nanometers. In some embodiments, the sealing structure 206 may have an upper surface substantially coplanar with the topmost surface of the low-k dielectric spacer structure 204. In some embodiments the sealing structure 206 comprises a low-k dielectric material, wherein the dielectric constant is less than 7, such as, for example, silicon oxynitride, silicon carbon nitride, silicon oxygen carbide, silicon oxygen carbon nitride, silicon nitride, or some other suitable low-k dielectric material. The sealing structure 206 has a first thickness $t_1$ measured in the z-direction. In some embodiments, the first thickness $t_1$ may be in a range of between, for example, approximately 2 nanometers and approximately 10 nanometers. To optimize the effectiveness of the isolation provided by the air spacer structure 110, the first thickness $t_1$ of the sealing structure 206 may be controlled such that a lower surface of the sealing structure 206 does not extend below the gate electrode 106 or upper conductive layer 214.

Thus, the air spacer structure 110 is defined by a cavity filled with air between the sealing structure 206, the low-k dielectric spacer structure 204, and the low-k dielectric layer 210, in some embodiments. In such embodiments, the air spacer structure 110 significantly reduces capacitance between the metal wire 218 and the gate electrode 106, the upper conductive layer 214, and/or the contact via 118 thereby increasing the reliability of the finFETs (e.g., 301, 303, 305) arranged on the same substrate 202.

FIG. 4 illustrates a cross-sectional view 400 of some embodiments of the integrated chip comprising multiple finFETs from the xz-plane. Thus, in some embodiments, the cross-sectional view 400 may correspond to cross-section line BB' of FIG. 2. In some embodiments, cross-section line BB' extends through the second finFET 303 of FIG. 3.

The semiconductor fin structures 203 are spaced apart by a fifth distance $d_5$. In some embodiments, the fifth distance $d_5$ is in a range of between, for example, approximately 20 nanometers and approximately 40 nanometers. In some embodiments, lower isolation structures 212 are arranged between and completely fill the space between lower portions of the semiconductor fin structures 203. In some embodiments, the dielectric fin structures 112 are arranged over the over the lower isolation structures 212. In some embodiments, the dielectric fin liner 208 separates the lower isolation structures 212 from the dielectric fin structures 112. In some embodiments, the lower isolation structures 212 have a width equal to the fifth distance $d_5$ that is greater than a width of the dielectric fin structures 112 equal to a second width $w_2$. In some embodiments, the second width $w_2$ is greater than approximately 6 nanometers. In some embodiments, the dielectric fin structures 112 comprise a low-k dielectric material, wherein the dielectric constant is less than 7, such as, for example, silicon carbon nitride, silicon oxygen carbide, silicon oxygen carbon nitride, or some other suitable low-k dielectric material. In some embodiments, the lower isolation structures 212 comprise a same or different material than the dielectric fin structures 112.

In some embodiments, the high-k dielectric layer 234 is a continuous layer from the cross-sectional view 400 that extends over the semiconductor fin structures 203, the dielectric fin structures 112, and the lower isolation structures 212. Further, in some embodiments, the interfacial layer 304 is arranged directly between the semiconductor fin structures 203 and the high-k dielectric layer 234. In some embodiments, the gate electrode 106 is arranged over portions of the high-k dielectric layer 234 and laterally around portions of the semiconductor fin structures 203.

The gate electrode 106 and the upper conductive layer 214 extends over the semiconductor fin structures 203 by a sixth distance $d_6$. The sixth distance $d_6$, in some embodiments, may be in a range of between, for example, approximately 4 nanometers and approximately 20 nanometers. In some embodiments, the dielectric fin structures 112 are arranged below topmost surfaces 106t of the gate electrode 106 and below the upper conductive layer 214. Thus, in some embodiments, a portion 402 of the gate electrode 106 may be arranged over the dielectric fin structures 112 such that the gate electrode 106 is shared over two adjacent semiconductor fin structures 203, and thus, over two adjacent finFETs. For example, in some embodiments, a complementary metal oxide semiconductor (CMOS) device 404 may comprise two finFETs coupled to one another through the gate electrode 106. Further, in some embodiments, to isolate the CMOS device 404 from other neighboring finFET devices, the high-k dielectric spacer structures 114 may be arranged over some of the dielectric fin structures 112. In such embodiments, the high-k dielectric spacer structures 114 extend above the topmost surfaces 106t of the gate electrode 106 and extend through the upper conductive layer 214. In some embodiments, the high-k dielectric spacer structures 114 have a second height $h_2$ in a range of between, for example, approximately 8 nanometers and approximately 46 nanometers. In some embodiments, the second height $h_2$ includes the high-k dielectric layer 234 arranged over the high-k dielectric spacer structures 114. Thus, the high-k dielectric spacer structures 114 arranged over the dielectric fin structures 112 provide electrical isolation between the gate electrode 106 of the CMOS device 404 and gate electrodes 106 of surrounding finFET devices. In such embodiments, the high-k dielectric spacer structures 114 may extend above the upper conductive layer 214 by a seventh distance $d_7$. In some embodiments, the seventh distance $d_7$ may be in a range of between, for example, approximately 4 nanometers and approximately 26 nanometers. In other embodiments, it will be appreciated that more or less of the dielectric fin structures 112 may be covered by the high-k dielectric spacer structures 114 than what is depicted in FIG. 4.

In some embodiments, the high-k dielectric spacer structures 114 and the high-k dielectric layer 234 may each comprise a high-k dielectric material, wherein the dielectric constant is greater than 7, such as, for example, hafnium oxide, zirconium oxide, hafnium aluminum oxide, hafnium silicon oxide, aluminum oxide, or some other suitable high-k dielectric material. Because of the high-k dielectric spacer structures 114, in some embodiments, the finFET devices over the substrate 202 may be arranged closer to one another than if the high-k dielectric spacer structures 114 were not present. In some embodiments, for example, the CMOS device 404 may have a size defined by the first distance $d_1$ that may be in a range of between, for example, approximately 30 nanometers and approximately 80 nanometers.

Figure 5:
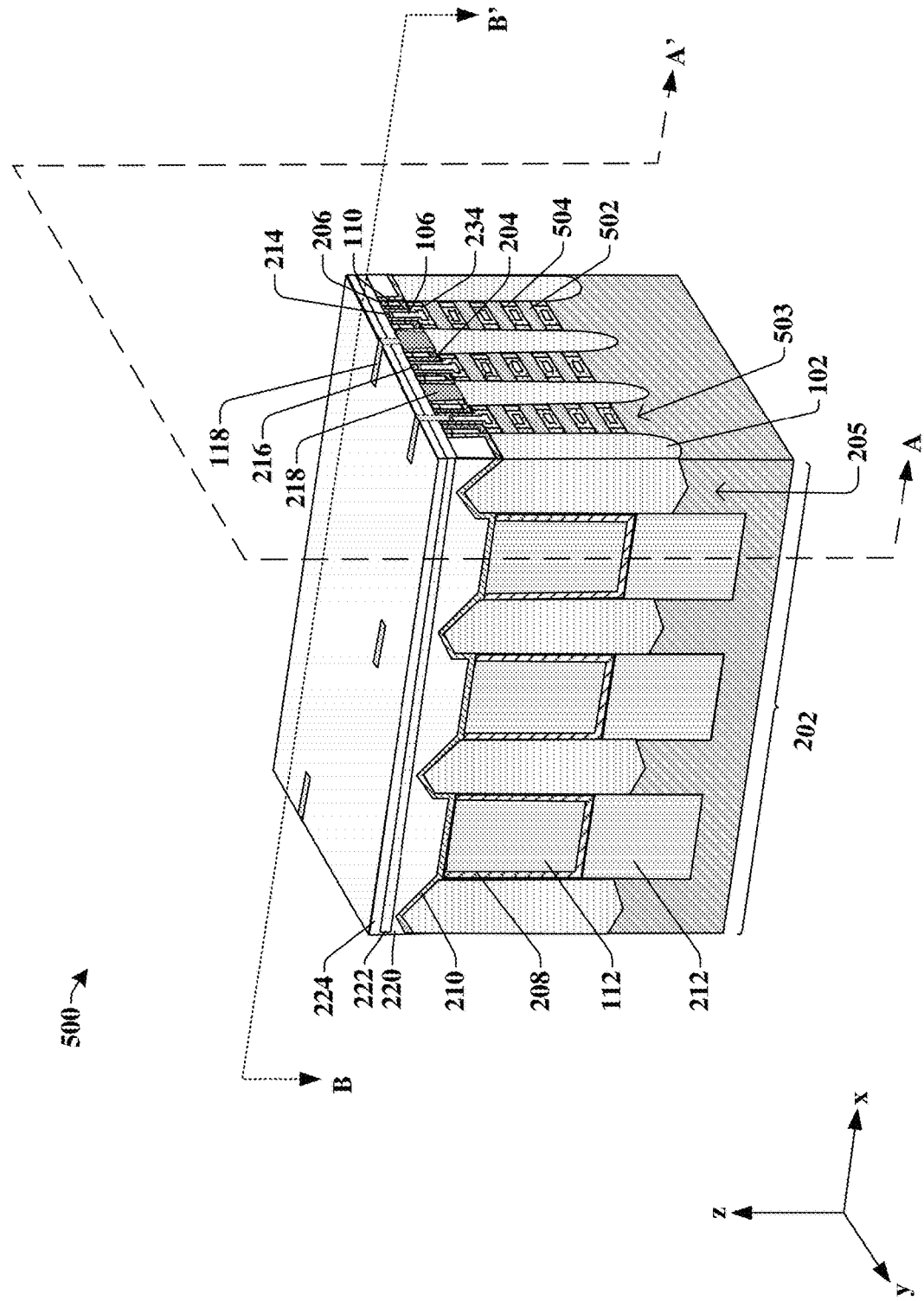
FIGS. 5-7 illustrate various views of some embodiments of an integrated chip comprising nanosheet field effect transistors corresponding to the layout schematic of FIG. 1.

FIG. 5 illustrates a perspective view 500 of some alternative embodiments of an integrated chip comprising multiple nanosheet field effect transistors (NSFETs) arranged over a same substrate.

Figure 6:
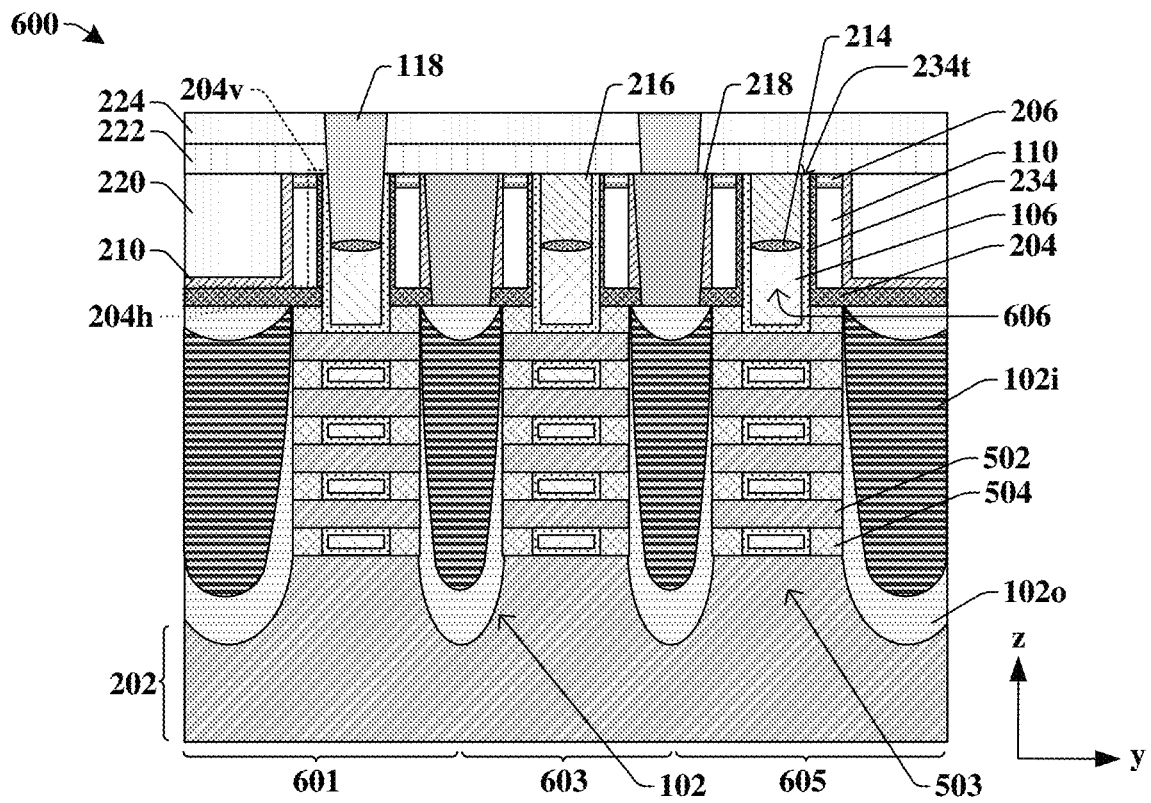
Figure 7:
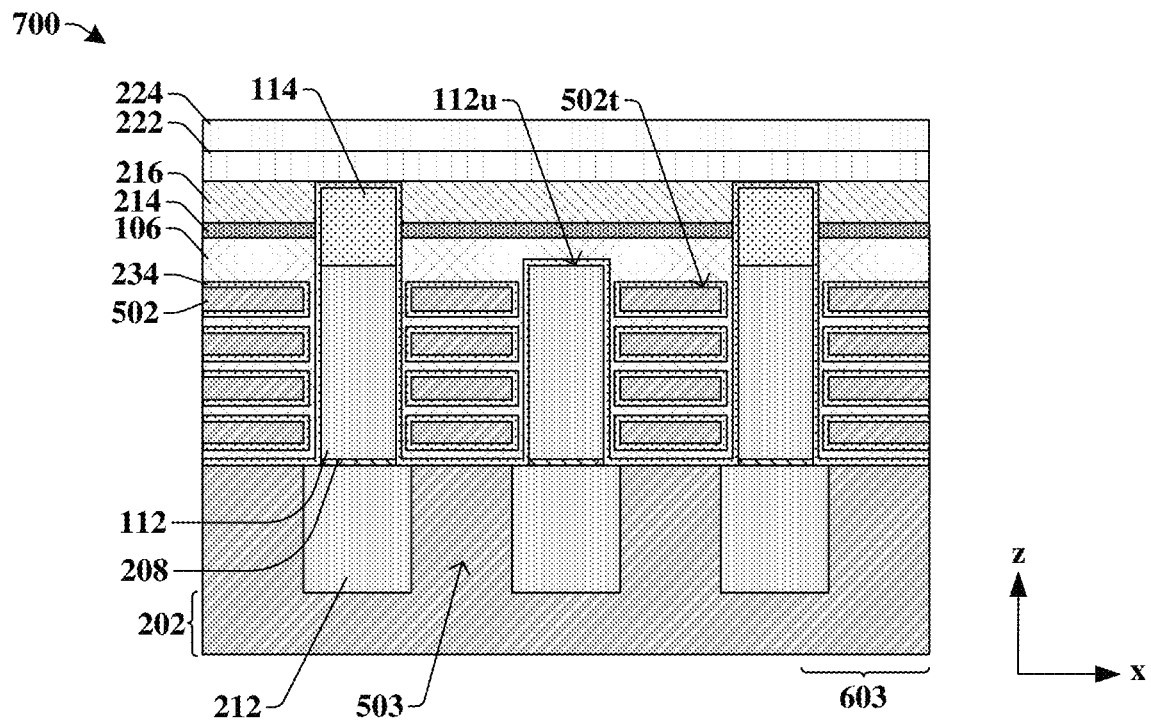

In some embodiments, instead of finFETs as illustrated in FIG. 2, the transistors (e.g., 101, 103, 105, 107) illustrated in FIG. 1 may correspond to NSFETs. It will be appreciated that in other instances, an NSFET may be referred to as a nanowire FET, a gate surrounding FET, a gate all around FET, or a multi-bridge channel FET, for example. Further, it will be appreciated that an NSFET as illustrated in FIGS. 5-7 may have higher performance speeds and be more reliable than a finFET because channel structures (e.g., nanosheet channel structures 502) of an NSFET have more surfaces surrounded by the gate electrode 106 than channel structures (e.g., semiconductor fin structure 203 of FIG. 2) of a finFET. However, an NSFET often has a more complex manufacturing process than the manufacturing process for forming a finFET.

As illustrated in the perspective view 500, the NSFETs may comprise nanosheet channel structures 502 arranged over lower semiconductor fin structures 503. In such embodiments, the nanosheet channel structures 502 may correspond to the channel structures (104 of FIG. 1). In such embodiments, upper and lower surfaces of the nanosheet channel structures 502 may be surrounded by the high-k dielectric layer 234 and the gate electrode 106. In some embodiments, each NSFET transistor comprises 4 nanosheet channel structures 502 arranged over one another in the z-direction, whereas in other embodiments, each NSFET transistor may comprise between 3 and 8 nanosheet channel structures 502. Further, in some embodiments, an NSFET may comprise inner-spacer structures 504 between nanosheet channel structures 502.

More details of the features of the perspective view 500 of FIG. 5 that promote a high NSFET density on the substrate 202 and that improve performance of the overall integrated chip are described in cross-sectional views 600 and 700 of FIGS. 6 and 7.

FIG. 6 illustrates a cross-sectional view 600 of some embodiments of an integrated chip comprising multiple NSFETs from the yz-plane of FIG. 5. Thus, in some embodiments, the cross-sectional view 600 may correspond to cross-section line AA' of FIG. 5.

In some embodiments, the cross-sectional view 600 includes a second NSFET 603 arranged between a first NSFET 601 and a third NSFET 605. In some embodiments, from the cross-sectional view 600 of FIG. 6, the nanosheet channel structures 502 have upper and lower surfaces surrounded by the high-k dielectric layer 234 and the gate electrode 106. In some embodiments (not shown), an interfacial layer (e.g., 304 of FIG. 3) is also arranged directly between the nanosheet channel structures 502 and the high-k dielectric layer 234. In some embodiments, the inner-spacer structures 504 may be arranged between the nanosheet channel structures 502 in the z-direction and between the high-k dielectric layer 234 and the source/drain regions 102 in the y-direction. In some embodiments, the source/drain regions 102 may have upper surfaces that are above upper ones of the nanosheet channel structures 502. Further, in such embodiments, an upper portion 606 of the gate electrode 106 may have lower surfaces that are below the upper surfaces of the surrounding source/drain regions 102. The high-k dielectric layer 234 and the inner-spacer structures 504 separate the gate electrode 106 from the source/drain regions 102, in some embodiments.

In some embodiments, the integrated chip may comprise the low-k dielectric spacer structures 204 over the nanosheet channel structures 502. In some embodiments, the inner-spacer structures 504 separate the low-k dielectric spacer structures 204 from directly contacting the nanosheet channel structures 502. In some embodiments, the horizontal portions 204h of the low-k dielectric spacer structures 204 are also arranged over the source/drain regions 102. Further, in some embodiments, the air spacer structures 110 are arranged over the low-k dielectric spacer structures 204 and are defined by surfaces of the low-k dielectric spacer structures 204, the sealing structure 206, and the low-k dielectric layer 210. The air spacer structures 110 reduce capacitance from the gate electrode 106 and surrounding conductive structures (e.g., metal wires 218, contact vias 118) and may allow the first, second, and third NSFETs 601, 603, 605 to be arranged closer to one another in the y-direction over the same substrate 202 without sacrificing device reliability.

FIG. 7 illustrates a cross-sectional view 700 of some embodiments of the integrated chip comprising multiple NSFETs from the xz-plane. Thus, in some embodiments, the cross-sectional view 700 may correspond to cross-section line BB' of FIG. 5. In some embodiments, cross-section line BB' extends through the second NSFET 603 of FIG. 6.

As illustrated in the cross-sectional view 700, the nanosheet channel structures 502 have all outer surfaces surrounded by the gate electrode 106. In some embodiments, the dielectric fin structures 112 have topmost surfaces 112u that are above topmost surfaces 502t of upper ones of the nanosheet channel structures 502. Further, as discussed in FIG. 4 regarding finFETs, in some embodiments comprising NSFETs, high-k dielectric spacer structures 114 may also be arranged directly over one or more of the dielectric fin structures 112 to provide electrical isolation between neighboring NSFETs to increase device density over the same substrate 202 in the x-direction.

FIGS. 8-36, 37A, 37B, and 38-44 illustrate various views 800-3600, 3700A, 3700B, 3800-4400 of some embodiments of a method of forming an integrated chip comprising multiple NSFETs over a substrate and comprising air spacer structures and high-k dielectric spacer structures to increase NSFET device density on the substrate without sacrificing device reliability. Although FIGS. 8-36, 37A, 37B, and 38-44 are described in relation to a method, it will be appreciated that the structures disclosed in FIGS. 8-36, 37A 37B, and 38-44 are not limited to such a method, but instead may stand alone as structures independent of the method.

Further, it will be appreciated that the method of FIGS. 8-36, 37A, 37B, and 38-44 may be modified to form finFETs over the substrate to produce the integrated chip illustrated in the perspective view 200, for example.

Figure 8:
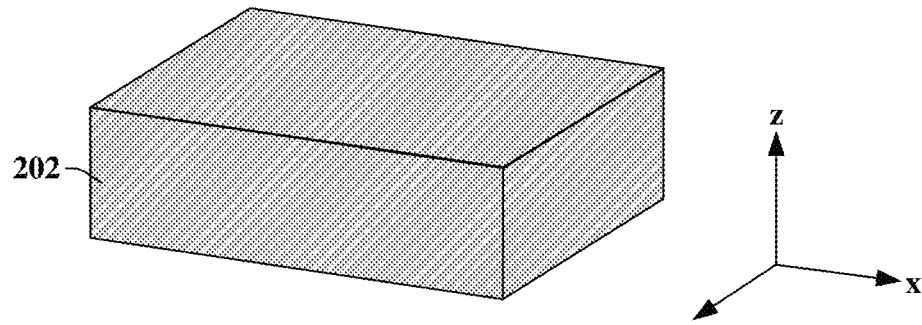
FIGS. 8-36, 37A, 37B, and 38-44 illustrate various views of some embodiments of a method of forming multiple nanosheet field effect transistors over a substrate, wherein performance and transistor density are optimized using air spacer structures and high-k dielectric spacer structures.

As shown in perspective view 800 of FIG. 8, a substrate 202 is provided. In some embodiments, the substrate 202 may be or comprise a semiconductor wafer, a semiconductor substrate, a silicon-on-insulator (SOI) substrate, or some other suitable substrate. In some embodiments, the substrate 202 may comprise a first semiconductor material such as, for example, silicon, germanium, or some other suitable semiconductor material. In such embodiments, the substrate 202 may be an intrinsic (e.g., not doped) semiconductor. In some other embodiments, the substrate 202 may be an extrinsic (e.g., doped) semiconductor.

Figure 9:
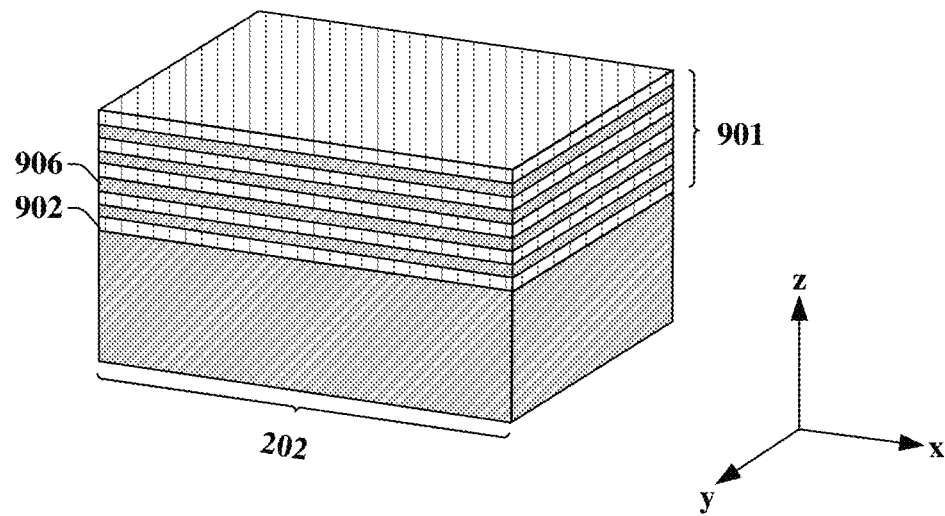

As shown in perspective view 900 of FIG. 9, in some embodiments, a stack of semiconductor layers 901 may be formed over the substrate 202. The stack of semiconductor layers 901 may comprise spacer layers 902 and semiconductor layers 906, wherein the spacer layers 902 and the semiconductor layers 906 are arranged in an alternating order in the stack of semiconductor layers 901. In other words, each one of the semiconductor layers 906 is arranged between a lower one of the spacer layers 902 and an upper one of the spacer layers 902. In some embodiments, the semiconductor layers 906 comprise the first semiconductor material, and the spacer layers 902 comprise a second semiconductor material that is different than the first semiconductor material. For example, in some embodiments, the first semiconductor material may comprise silicon, whereas the second semiconductor material may comprise germanium or silicon germanium. In some embodiments, the semiconductor layers 906 and the spacer layers 902 are formed by an epitaxy growth process.

Further, in some embodiments, the thicknesses of the semiconductor layers 906 and the spacer layers 902 may be in a range of between, for example, approximately 4 nanometers and approximately 8 nanometers. Further, in some embodiments, a topmost layer of the stack of semiconductor layers 901 may be one of the spacer layers 902 to protect the semiconductor layers 906 during future processing steps. In some embodiments, it will be appreciated that although four semiconductor layers 906 are illustrated in the perspective view 900 of FIG. 9, the number of semiconductor layers 906 in the stack of semiconductor layers 901 may be less than or greater than four. In some embodiments, for example, the number of semiconductor layers 906 in the stack of semiconductor layers 901 is between 3 and 8.

Figure 10:
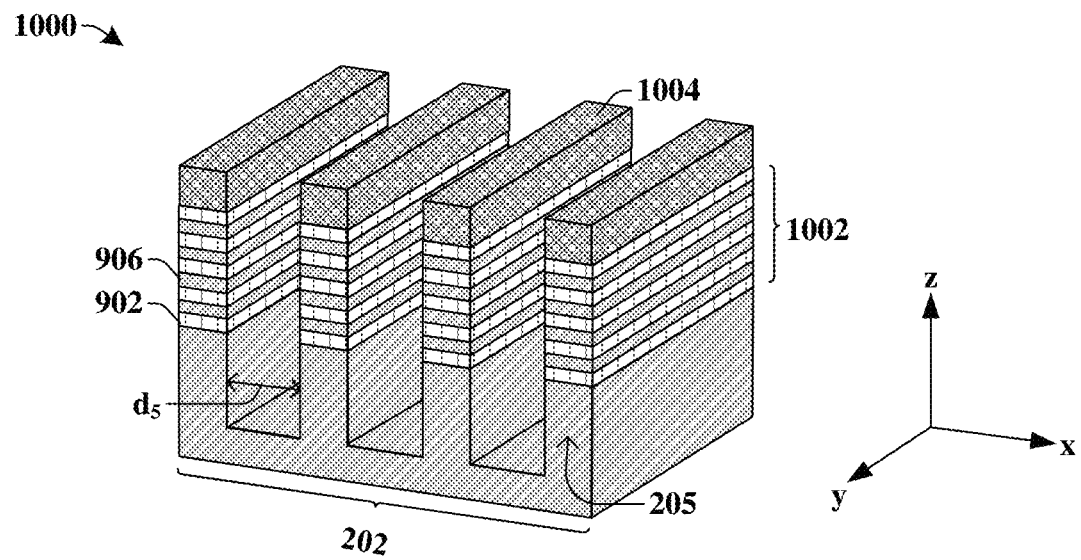

As shown in perspective view 1000 of FIG. 10, in some embodiments, first masking structures 1004 are arranged over the stack of semiconductor layers (901 of FIG. 9). In some embodiments, the first masking structures 1004 may be formed using photolithography and removal (e.g., etching) processes. In some embodiments, the first masking structures 1004 may comprise photoresist materials or hard mask materials.

Further, as shown in perspective view 1000 of FIG. 10, in some embodiments, a removal process may be performed according to the first masking structures 1004 to form sub-semiconductor fins 205 from the substrate 202 that extend in the z-direction. In some embodiments, the removal process may be or comprise a dry, vertical etch. The sub-semiconductor fins 205 are continuously connected to one another through the substrate 202. In some embodiments, the sub-semiconductor fins 205 are spaced apart from one another by a fifth distance $d_5$. In some embodiments, the fifth distance $d_5$ may be in a range of between, for example, approximately 20 nanometers and approximately 40 nanometers.

In some embodiments, the removal process removes portions of the semiconductor layers 906 and the spacer layers 902 that are uncovered by the first masking structures 1004. Therefore, after the removal process, patterned stacks of semiconductor layers 1002 comprising the spacer layers 902 and the semiconductor layers 906 are arranged over the sub-semiconductor fins 205. It will be appreciated that in other embodiments, more or less than four sub-semiconductor fins 205 and patterned stacks of semiconductor layers 1002.

Figure 11:
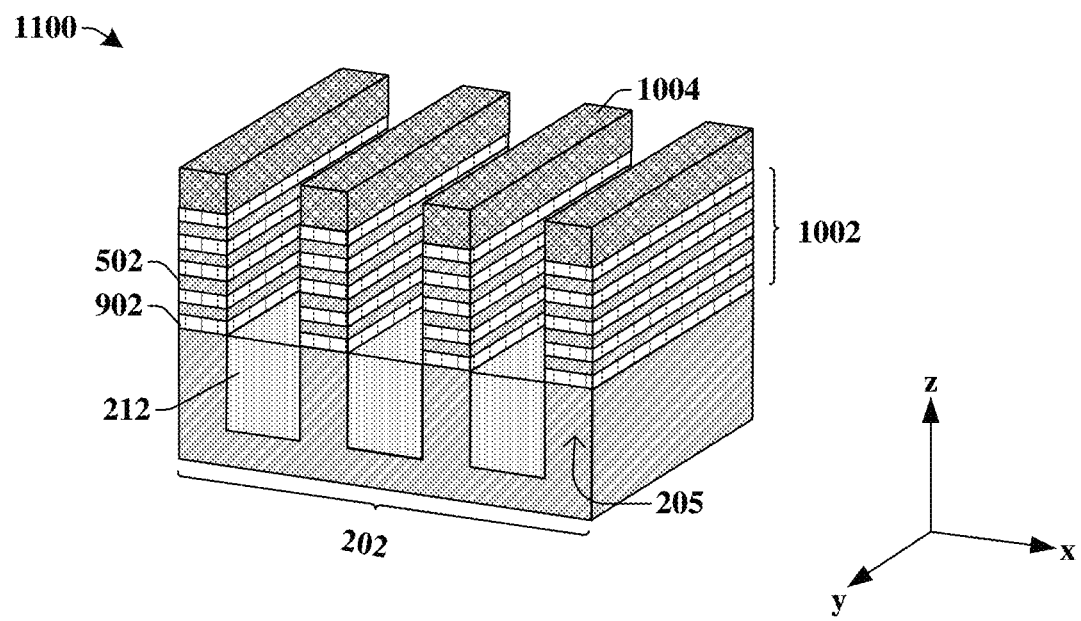

As shown in perspective view 1100 of FIG. 11, in some embodiments, lower isolation structures 212 may be formed over the substrate 202 between the sub-semiconductor fins 205. The lower isolation structures 212 may provide electrical isolation between the sub-semiconductor fins 205, in some embodiments. In some embodiments, the lower isolation structures 212 may comprise a dielectric material such as, for example, a nitride (e.g., silicon nitride, silicon oxynitride, silicon oxygen carbon nitride, silicon carbon nitride), a carbide (e.g., silicon carbide, silicon oxygen carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the lower isolation structures 212 comprise a low-k dielectric material, wherein the dielectric constant is less than 7.

In some embodiments, the lower isolation structures 212 are formed through various steps comprising a thermal oxidation or deposition process (e.g., physical vapor deposition (PVD), chemical vapor deposition (CVD), PE-CVD, atomic layer deposition (ALD), sputtering, etc.), and removal processes (e.g., wet etching, dry etching, chemical mechanical planarization (CMP), etc.). Further, in some embodiments, prior to the formation of the lower isolation structures 212, a silicon liner layer (not shown) is formed over the substrate 202, and along inner sidewalls of the sub-semiconductor fins 205 and the patterned stacks of semiconductor layers 1002. Then, a dielectric material is deposited over the silicon liner layer, and the silicon liner layer and the dielectric material are etched back to form the lower isolation structures 212. In such embodiments, the lower isolation structures 212 may be separated from the sub-semiconductor fins 205 by the silicon liner layer. It will be appreciated that other processes and/or order of steps to form the lower isolation structures 212 are also within the scope of the disclosure.

Figure 12:
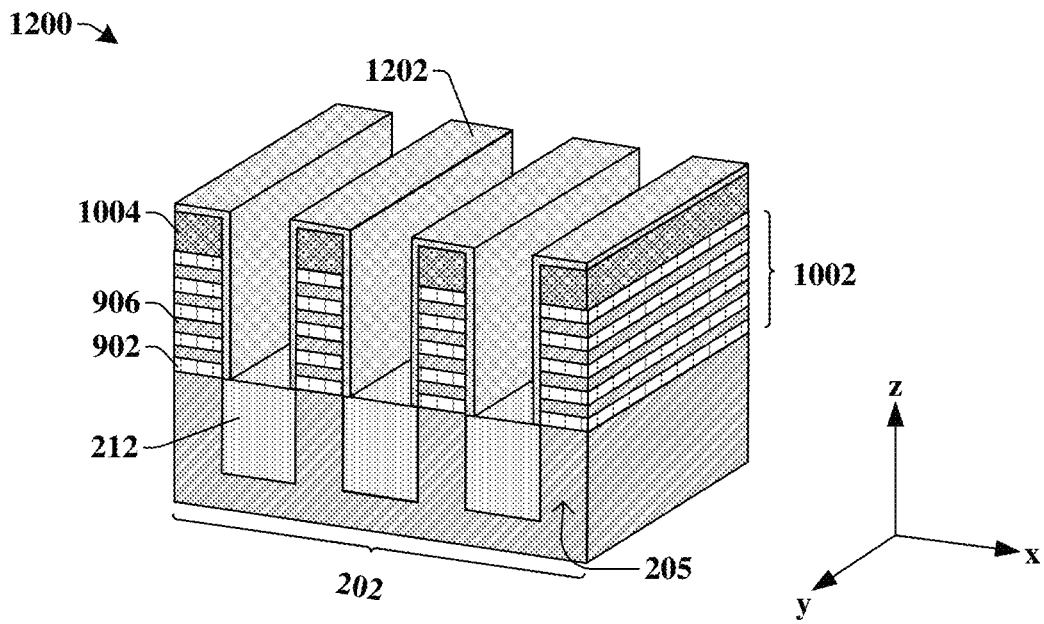

As shown in perspective view 1200 of FIG. 12, in some embodiments, a conformal semiconductor layer 1202 is formed over outer surfaces of the patterned stacks of semiconductor layers 1002 and over the first masking structures 1004. In some embodiments, the conformal semiconductor layer 1202 comprises a semiconductor material, such as germanium, silicon germanium, or the like. In some embodiments, the conformal semiconductor layer 1202 comprises a same material as the spacer layers 902. Further, in some embodiments, the conformal semiconductor layer 1202 may be formed by an epitaxy growth process or a deposition process (e.g., PVD, CVD, PE-CVD, ALD, sputtering, etc.). In some embodiments, a silicon liner layer (not shown) arranged between the lower isolation structures 212 and the sub-semiconductor fins 205 acts as a seed layer for growth of the conformal semiconductor layer 1202. In some embodiments, the conformal semiconductor layer 1202 is not formed over upper surfaces of the lower isolation structures 212.

Figure 13:
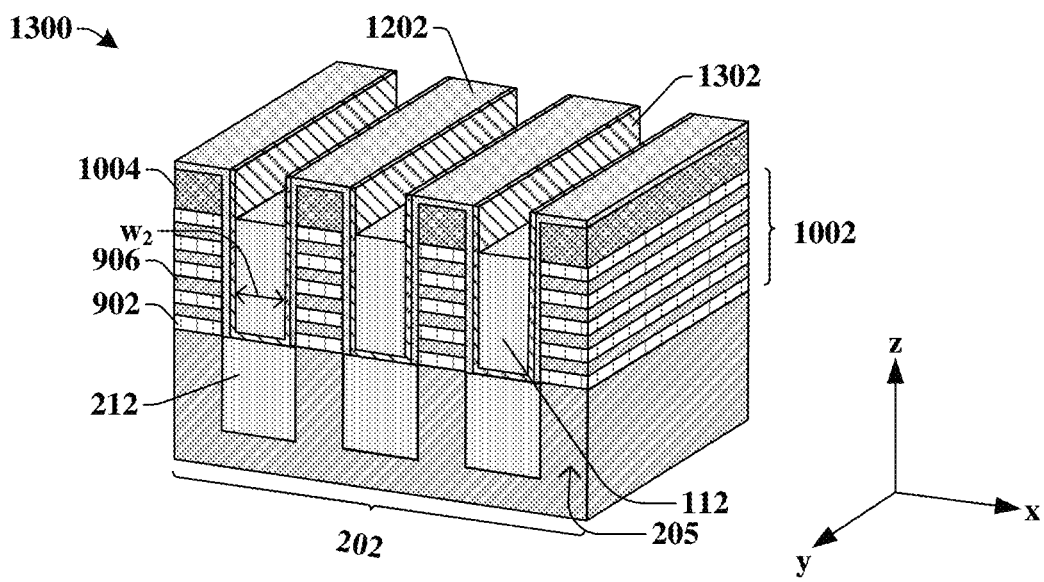

As shown in perspective view 1300 of FIG. 13, in some embodiments, a low-k dielectric material 1302 is formed on inner sidewalls of the conformal semiconductor layer 1202, and dielectric fin structures 112 are formed over the lower isolation structures 212. The dielectric fin structures 112 extend in the y-direction and are arranged between the patterned stacks of semiconductor layers 1002 in the x-direction. In some embodiments, the low-k dielectric material 1302 and the dielectric fin structures 112 are formed by deposition (e.g., PVD, CVD, PE-CVD, ALD, sputtering, etc.) and removal (e.g., etching, chemical mechanical planarization (CMP), etc.) processes, and the dielectric fin structures 112 have upper surfaces below upper surfaces of the low-k dielectric material 1302. In some embodiments, the dielectric fin structures 112 have a second width $w_2$ that is greater than, for example approximately 6 nanometers. In some embodiments, the low-k dielectric material 1302 is arranged directly between the dielectric fin structures 112 and the lower isolation structures 212. In some embodiments, the low-k dielectric material 1302 and the dielectric fin structures 112 and the lower isolation structures 212 may each comprise a low-k dielectric material, wherein the dielectric constant is less than 7, such as, for example, silicon oxynitride, silicon carbon nitride, silicon oxygen carbide, silicon oxygen carbon nitride, silicon nitride, or some other suitable low-k dielectric material. Further, in some embodiments, the low-k dielectric material 1302 may comprise a different material than the dielectric fin structures 112 for selective removal processes.

Figure 14:
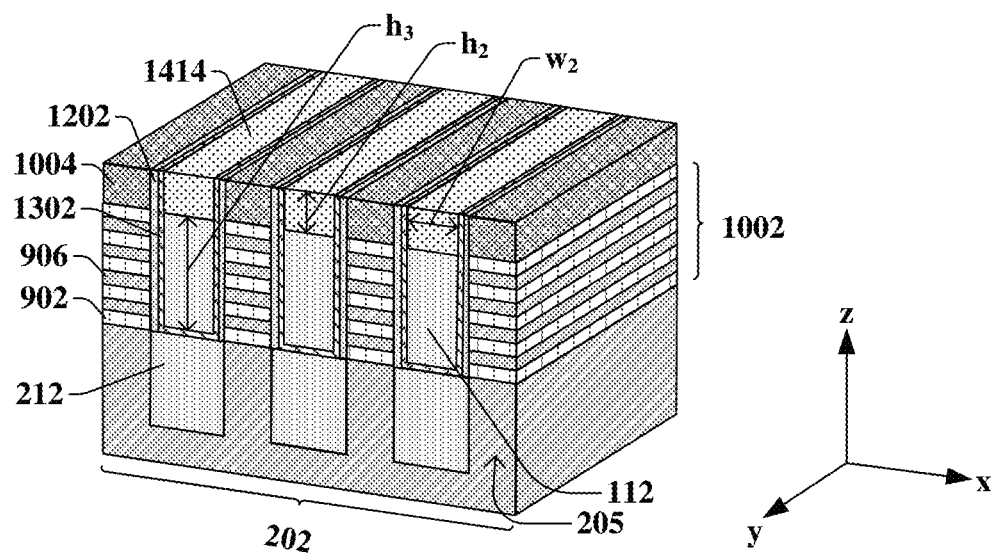

As shown in perspective view 1400 of FIG. 14, in some embodiments, high-k dielectric fins 1414 are formed directly over the dielectric fin structures 112. In some embodiments, the high-k dielectric fins 1414 have the same second width $w_2$ as the dielectric fin structures 112. In some embodiments, the high-k dielectric fins 1414 have a second height $h_2$ measured in the z-direction that is in a range of between, for example, approximately 8 nanometers and approximately 46 nanometers. In some embodiments, a ratio between the second height $h_2$ of the high-k dielectric fins 1414 and a third height $h_3$ of the dielectric fin structures 112 is in a range of between approximately 0.125 and approximately 8. The larger the second height $h_2$ of the high-k dielectric fins 1414 is, the more protected the dielectric fin structures 112 are from future patterning steps, as the high-k dielectric fins 1414 act as a hard mask to prevent loss of the dielectric fin structures 112 during future patterning steps. Thus, in some embodiments, the high-k dielectric fins 1414 are taller than the dielectric fin structures 112, whereas in other embodiments, the high-k dielectric fins 1414 are shorter than the dielectric fin structures 112. In some embodiments, the high-k dielectric fins 1414 are formed by are formed by deposition (e.g., PVD, CVD, PE-CVD, ALD, sputtering, etc.) and removal (e.g., etching, chemical mechanical planarization (CMP), etc.) processes. In some embodiments, the removal process is a CMP process, for example, which may also remove the conformal semiconductor layer 1202 from above the first masking structures 1004. In some embodiments, the high-k dielectric fins 1414 comprise a high-k dielectric material, wherein the dielectric constant is greater than 7, such as, for example, hafnium oxide, zirconium oxide, hafnium aluminum oxide, hafnium silicon oxide, aluminum oxide, or some other suitable high-k dielectric material.

Figure 15:
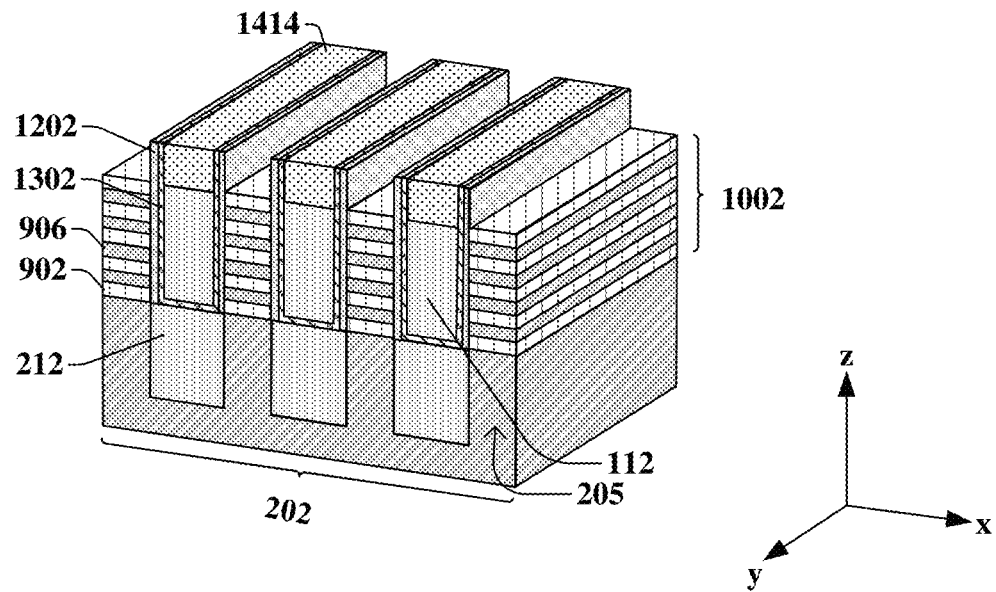

As shown in perspective view 1500 of FIG. 15, in some embodiments, the first masking structures (1004 of FIG. 14) are removed. In some embodiments, the first masking structure (1004 of FIG. 14) are removed by a wet etchant, for example.

Figure 16:
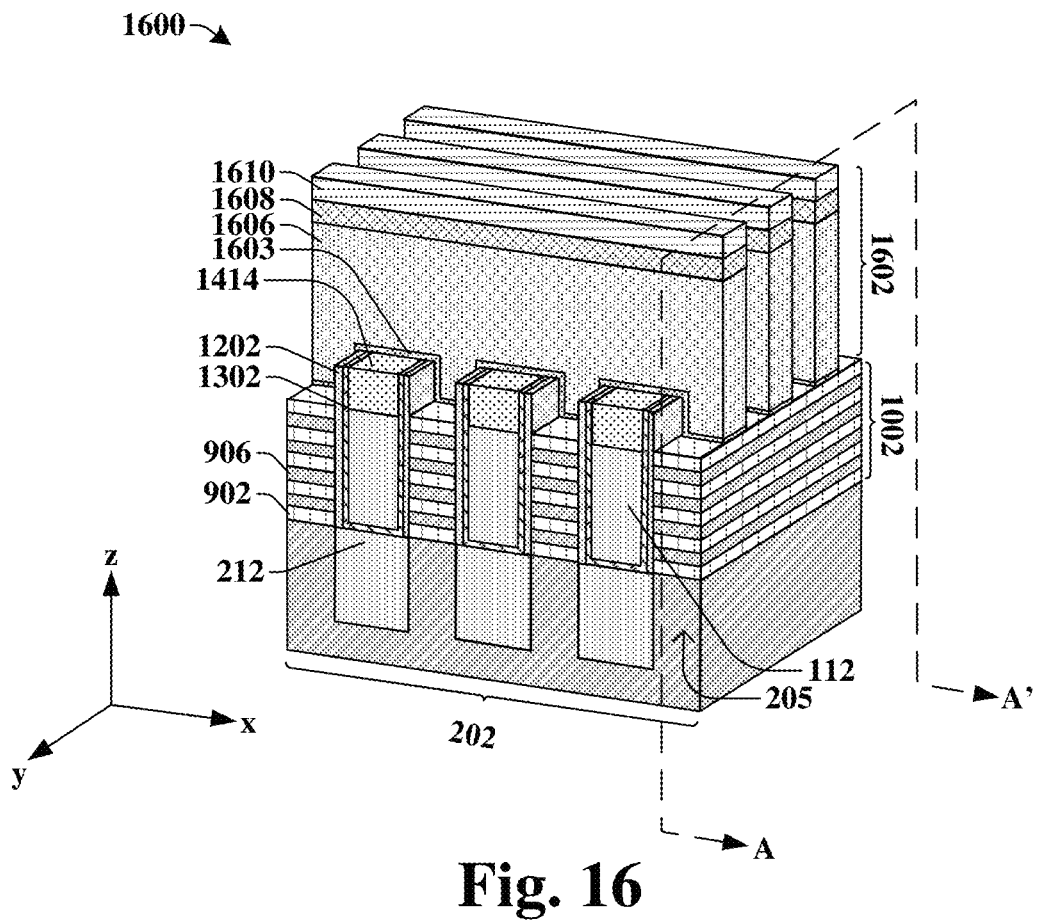

As shown in perspective view 1600 of FIG. 16, in some embodiments, dummy gate structures 1602 may be formed over the patterned stacks of semiconductor layers 1002. Each dummy gate structure 1602 may extend over each patterned stack of semiconductor layer 1002 in the x-direction. Further, the dummy gate structures 1602 may be spaced apart from one another in the y-direction. In some embodiments, the dummy gate structures 1602 comprise a dummy interfacial layer 1603 arranged directly over upper ones of the spacer layers 902, the high-k dielectric fins 1414, the low-k dielectric material 1302, and the conformal semiconductor layer 1202. In some embodiments, the dummy interfacial layer 1603 may comprise, for example, a dielectric material such as a nitride (e.g., silicon nitride, silicon oxynitride), a carbide (e.g., silicon carbide), an oxide (e.g., silicon oxide), or some other suitable material.

In some embodiments, the dummy gate structures 1602 further comprise dummy gate electrodes 1606 arranged over the dummy interfacial layer 1603 and extending in the z-direction. The dummy gate electrodes 1606 may be defined by patterning using second dummy masking structures 1610 arranged over first dummy masking structures 1608. In some embodiments, the dummy gate electrodes 1606 comprise, for example, polysilicon. In some embodiments, the first and second dummy masking structures 1608, 1610 comprise photoresist materials or hard mask materials and are formed by way of photolithography processes. It will be appreciated that in other embodiments, more or less than three dummy gate structures 1602 may be formed over the substrate 202.

Figure 17:
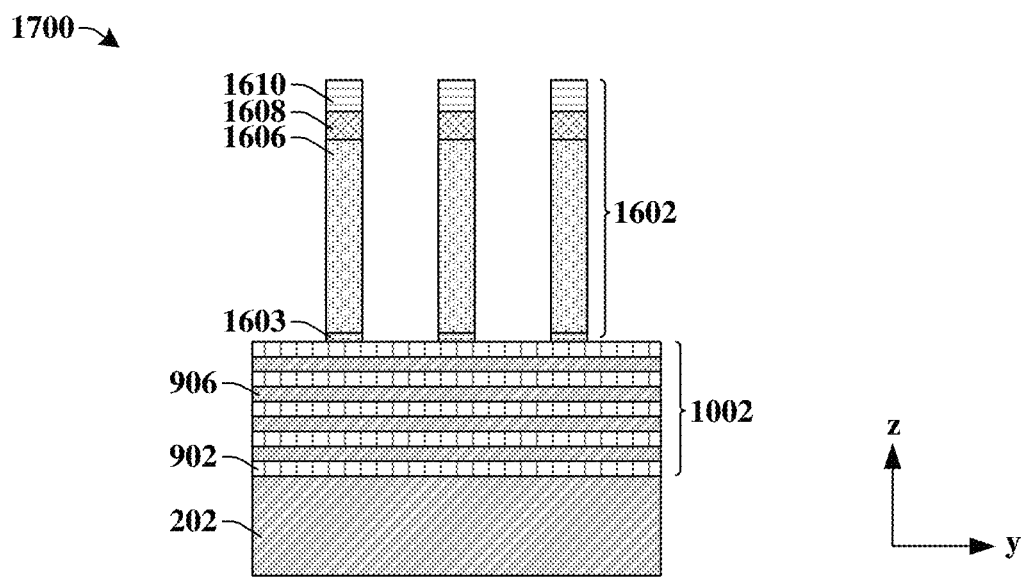

FIG. 17 illustrates a cross-sectional view 1700 of some embodiments according to cross-section line AA' of FIG. 16. Thus, the cross-sectional view 1700 is a cross-section from the yz-plane.

Figure 18:
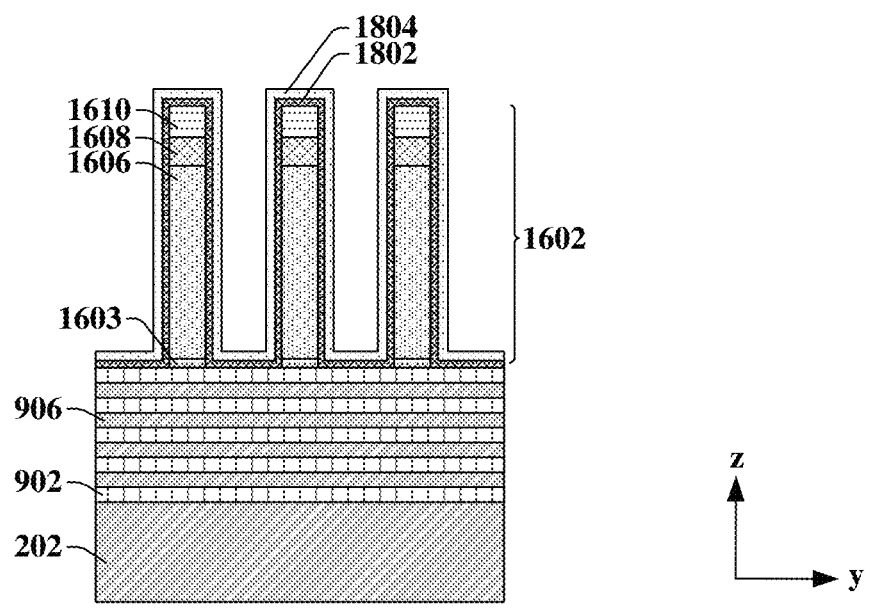

As shown in cross-sectional view 1800 of FIG. 18, in some embodiments, a first low-k dielectric spacer layer 1802 is formed over the dummy gate structures 1602 and over an upper one of the spacer layers 902. In some embodiments, the first low-k dielectric spacer layer 1802 comprises, for example, a low-k dielectric material, wherein the dielectric constant is less than 7, such as, for example silicon dioxide, silicon oxygen nitride, silicon carbon nitride, silicon oxygen carbide, silicon oxygen carbon nitride, silicon nitride, or the like. Further, a second low-k dielectric spacer layer 1804 may be formed over the first low-k dielectric spacer layer 1802. In some embodiments, the second low-k dielectric spacer layer 1804 also comprises a low-k dielectric material, but comprises a different low-k dielectric material than the first low-k dielectric spacer layer 1802. In some embodiments, the first and second low-k dielectric spacer layers 1802, 1804 are formed by way of a deposition process (e.g., CVD, PVD, PE-CVD, ALD, sputtering, etc.).

Figure 19:
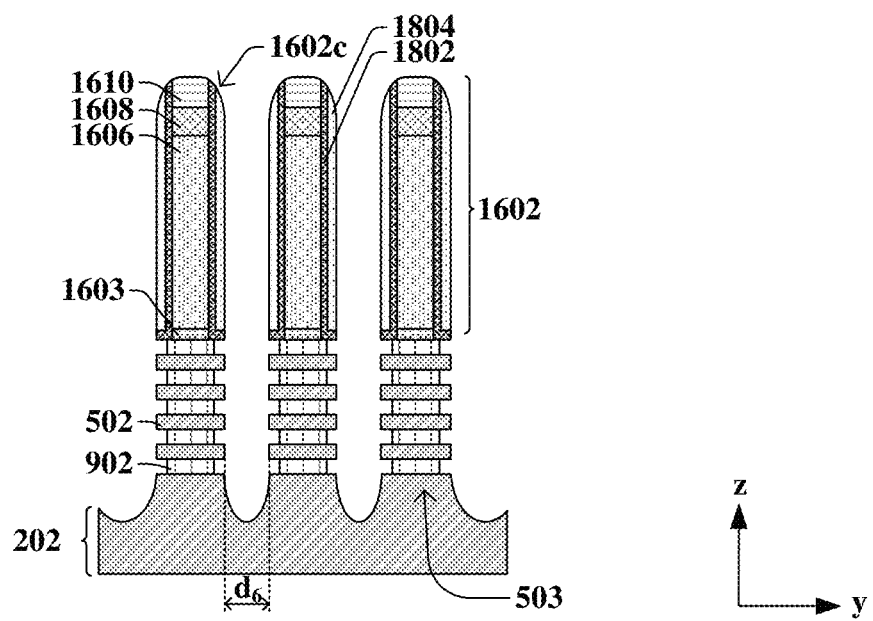

As shown in cross-sectional view 1900 of FIG. 19, in some embodiments, a removal process is formed according to the dummy gate structures 1602 to form nanosheet channel structures 502 from the semiconductor layers (906 of FIG. 18). In some embodiments, the nanosheet channel structures 502 may be spaced apart by a sixth distance $d_6$ in the y-direction. In some embodiments, the sixth distance $d_6$ may be in a range of between, for example, approximately 10 nanometers and approximately 50 nanometers. In some embodiments, the removal process of FIG. 19 may comprise a vertical dry etching process using one or more dry etchants. For example, in some embodiments, a first dry etchant may be used to remove the first and second low-k dielectric spacer layers 1802, 1804 that extend in the y-direction, whereas a second dry etchant may be used to remove portions of the spacer layers 902 and the semiconductor layers (906 of FIG. 18). The first and/or second dummy masking structures 1608, 1610 substantially resist removal by the dry etchants used in the removal process of FIG. 19 to protect the dummy gate electrodes 1606. Further, in some embodiments, the removal process of FIG. 19 may remove portions of the substrate 202 arranged between the dummy gate structures 1602, thereby forming lower semiconductor fin structures 503 protruding from the substrate 202 in the z-direction. In some embodiments, the removal process of FIG. 19 also comprises an isotropic etchant to remove portions of the spacer layers 902 in the y-direction. Thus, after the removal process of FIG. 19, the nanosheet channel structures 502 are wider than the spacer layers 902.

It will be appreciated that the nanosheet channel structures 502 may exhibit rectangle-like shapes as illustrated in the cross-sectional view 1900 of FIG. 19, whereas in other embodiments, the nanosheet channel structures 502 may exhibit circles, octagons, ovals, diamonds, or the like. Further, after the removal process of FIG. 19, in some embodiments, the dummy gate structures 1602 may have upper rounded corners 1602c as a result of vertical etching processes.

Figure 20:
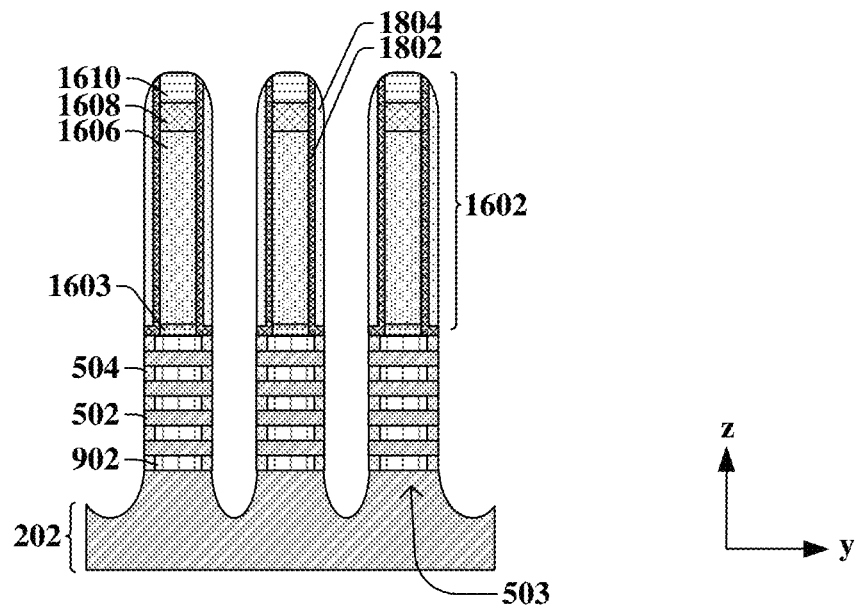

As shown in cross-sectional view 2000 of FIG. 20, in some embodiments, inner-spacer structures 504 are formed between the nanosheet channel structures 502 in the z-direction. In some embodiments, the inner-spacer structures 504 surround the spacer layers 902 in the y-direction have outermost sidewalls substantial coplanar with the nanosheet channel structures 502. In some embodiments, the inner-spacer structures 504 are formed by a deposition process (e.g., CVD, PVD, PE-CVD, ALD, sputtering, etc.), which may be followed by a removal process (e.g., etching). For example, in some embodiments, a continuous layer may first be formed over the dummy gate structures 1602 and the substrate 202, and then, a vertical etching process may be conducted to remove portions of the continuous layer to form the inner-spacer structures 504. Further, in some embodiments, the inner-spacer structures 504 comprise a low-k dielectric material (i.e., dielectric constant less than 7) such as, for example, silicon oxynitride, silicon carbon nitride, silicon oxygen carbide, silicon oxygen carbon nitride, silicon nitride or some other suitable material.

Figure 21:
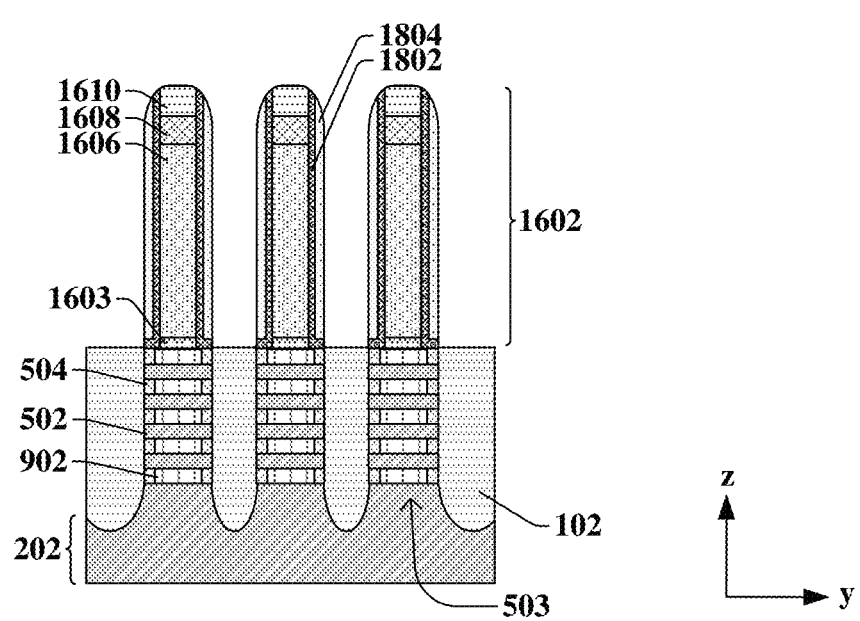

As shown in cross-sectional view 2100 of FIG. 21, source/drain regions 102 are formed over the substrate 202 and between the lower semiconductor fin structures 503. In some embodiments, the source/drain regions 102 are formed by way of an epitaxy growth process. Further, in some embodiments, the source/drain regions 102 comprise a semiconductor material. For example, in some embodiments, the source/drain regions 102 comprise silicon, germanium, or silicon germanium. In some embodiments, the source/drain regions 102 are formed to have the same doping concentrations. In some embodiments, from the cross-sectional view 2100, the source/drain regions 102 directly surround each of the nanosheet channel structures 502 in the y-direction.

Figure 22:
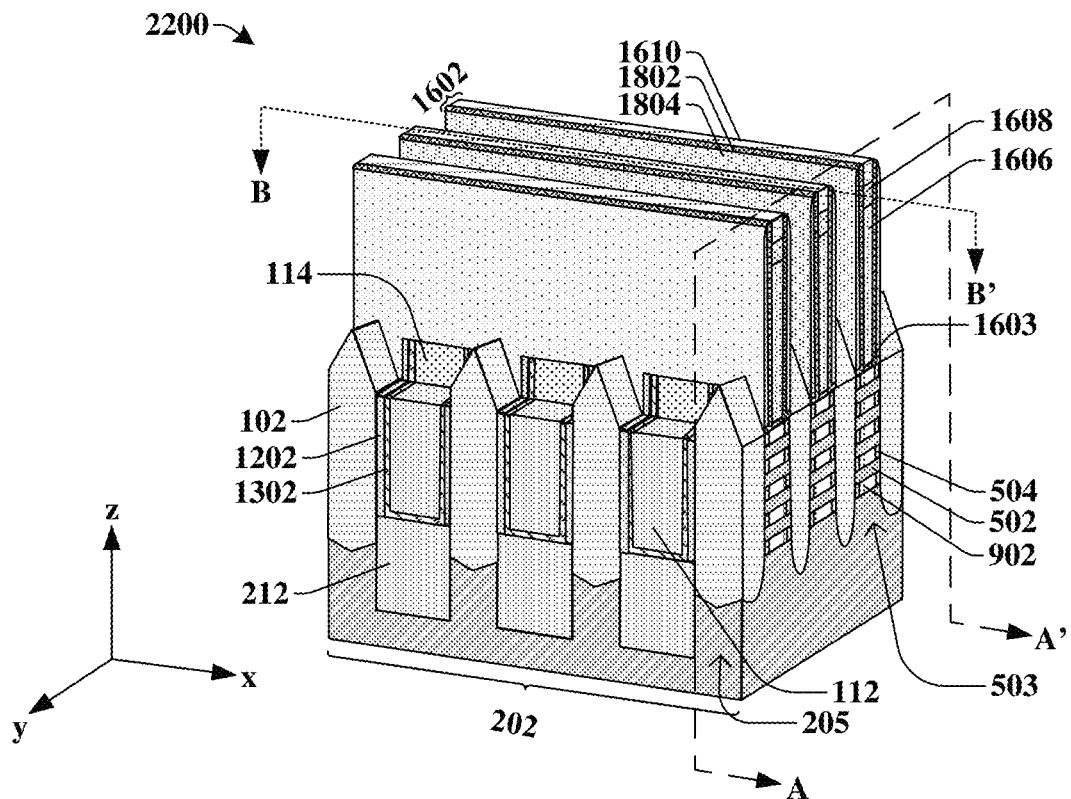

FIG. 22 illustrates a perspective view 2200 of the integrated chip after the formation of the source/drain regions 102. Thus, in some embodiments, the cross-sectional view 2100 of FIG. 21 corresponds to cross-section line AA' of FIG. 22.

As illustrated in the perspective view 2200 of FIG. 22, the source/drain regions 102 may comprise hexagonal or diamond-like shapes. Further, in some embodiments, portions of the high-k dielectric fins (1414 of FIG. 16) that do not underlie the dummy gate structures 1602 are removed during the removal process of FIG. 19. In other embodiments, portions of the high-k dielectric fins (1414 of FIG. 16) may be moved during a different step. Nevertheless, the remaining portions of the high-k dielectric fins (1414 of FIG. 16) under the dummy gate structures 1602 form high-k dielectric spacer structures 114 arranged over portions of the dielectric fin structures 112.

Figure 23:
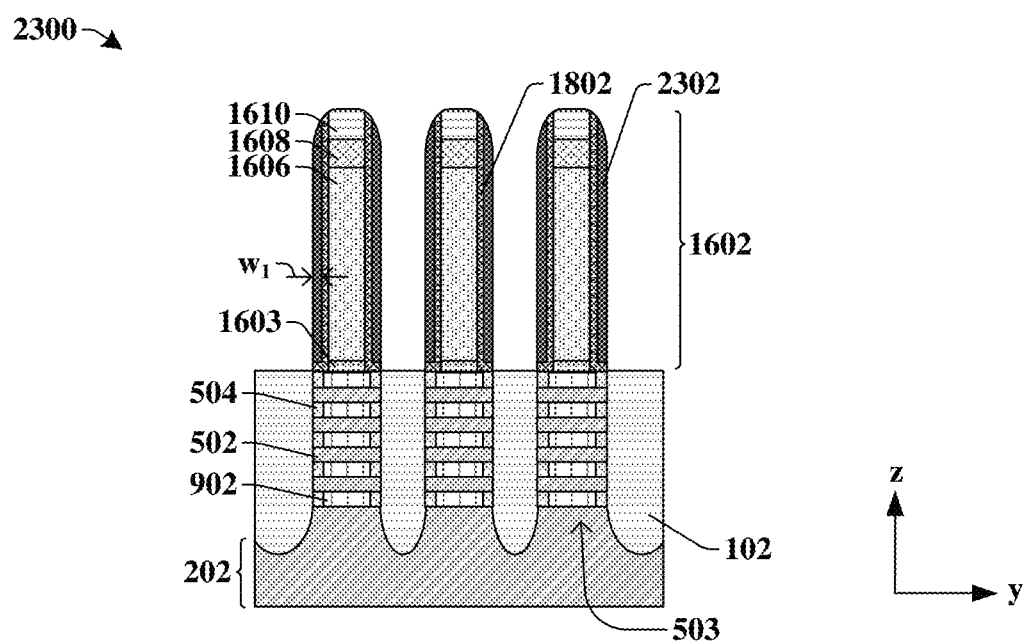

FIG. 23 illustrates a cross-sectional view 2300 that proceeds after the cross-sectional view 2100 of FIG. 21.

As shown in the cross-sectional view 2300, in some embodiments, the second low-k dielectric spacer layers (1804 of FIG. 21) are selectively removed from the dummy gate structures 1602, and dummy spacer structures 2302 are formed over the first low-k dielectric spacer layers 1802. In some embodiments, the dummy spacer structures 2302 may be formed by way of a deposition process (e.g., CVD, PVD, PE-CVD, ALD, sputtering, etc.) followed by a removal process (e.g., vertical etching). In some embodiments, the dummy spacer structures 2302 may have a first width $w_1$ measured in the y-direction. In some embodiments, the first width $w_1$ may be in a range of between, for example, approximately 0.5 nanometers and approximately 6 nanometers. In some embodiments, the dummy spacer structures 2302 comprise, for example, a silicon-based material, such as, for example, silicon, silicon boron, silicon germanium boron, or an oxygen-based material, such as, for example, silicon dioxide or silicon oxygen carbon. The dummy spacer structures 2302 comprise a different material than the first low-k dielectric spacer layers 1802.

In other embodiments, the first low-k dielectric spacer layers 1802 may also get removed with the second low-k dielectric spacer layers (1804 of FIG. 21). Then, in such embodiments, the first low-k dielectric spacer layers 1802 may be re-deposited over the dummy gate structures 1602 and the source/drain regions 102. In such embodiments, the first low-k dielectric spacer layers 1802 may be arranged over the source/drain regions 102.

Figure 24:
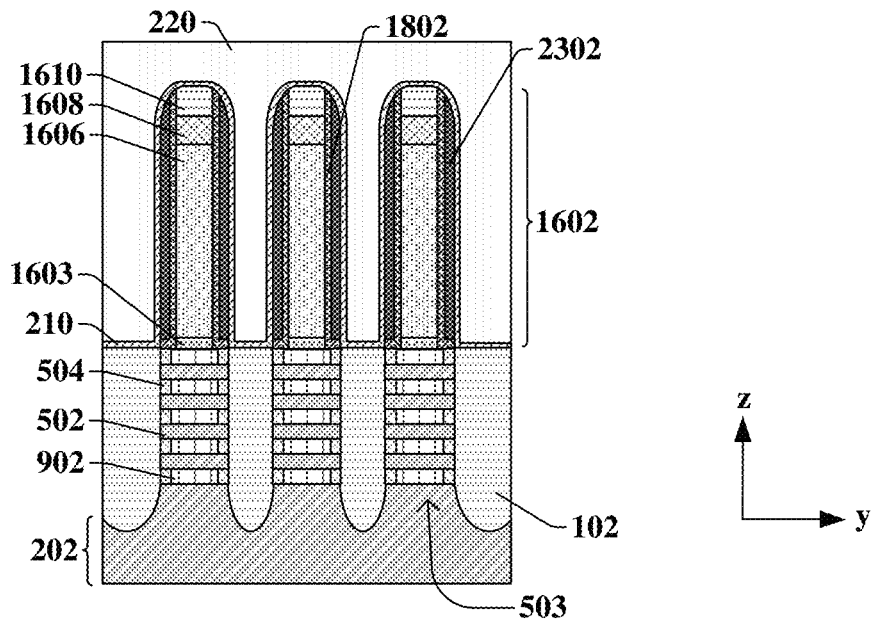

As shown in cross-sectional view 2400 of FIG. 24, in some embodiments, a low-k dielectric layer 210 is formed continuously over the source/drain regions 102 and the dummy gate structures 1602. In some embodiments, the low-k dielectric layer 210 is formed by way of a deposition process (e.g., CVD, PVD, PE-CVD, ALD, sputtering, etc.), and comprises a low-k dielectric material (i.e., the dielectric constant is less than 7), such as, for example, silicon oxynitride, silicon carbon nitride, silicon oxygen carbide, silicon oxygen carbon nitride, silicon nitride, or some other suitable low-k dielectric material.

Further, as shown in the cross-sectional view 2400 of FIG. 24, an upper isolation structure 220 is formed over and completely between the dummy gate structures 1602 and the source/drain regions 102. The upper isolation structure 220 may also be formed by way of a deposition process (e.g., PVD, CVD, PE-CVD, ALD, sputtering, etc.). In some embodiments, the upper isolation structure 220 comprises, for example, a dielectric material such as, for example, a nitride (e.g., silicon nitride, silicon oxynitride, silicon oxygen carbon nitride, silicon carbon nitride), a carbide (e.g., silicon carbide, silicon oxygen carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 25:
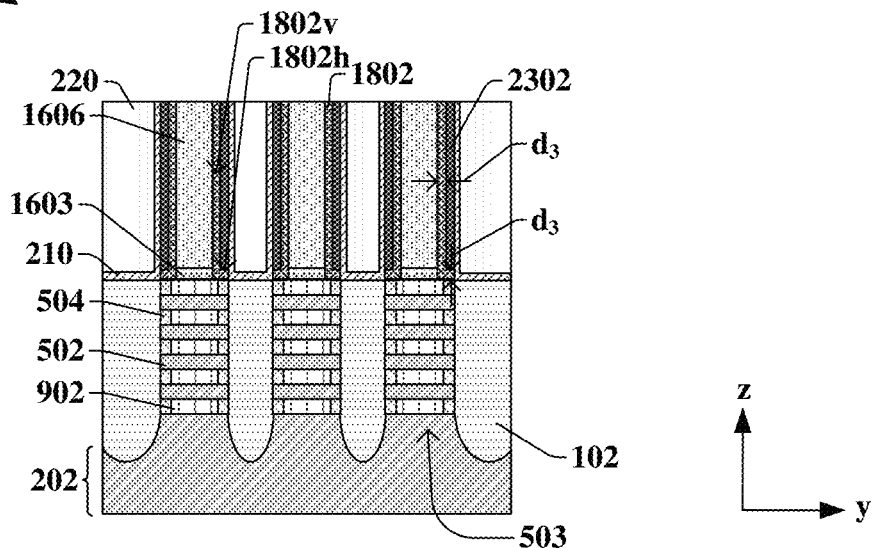

As shown in cross-sectional view 2500 of FIG. 25, a chemical mechanical planarization (CMP) process is conducted to remove the first and second dummy masking structures (1608, 1610 of FIG. 24) such that the dummy gate electrodes 1606, the first low-k dielectric spacer layers 1802, the dummy spacer structures 2302, the low-k dielectric layer 210, and the upper isolation structure 220 have upper surfaces that are substantially coplanar with one another. Further, in some embodiments, the first low-k dielectric spacer layers 1802 comprises horizontal portions 1802$h$ that have a height measured in the z-direction equal to a third distance $d_3$ and comprises vertical portions 1802$v$ that have a width measured in the y-direction equal to the third distance $d_3$.

Figure 26:
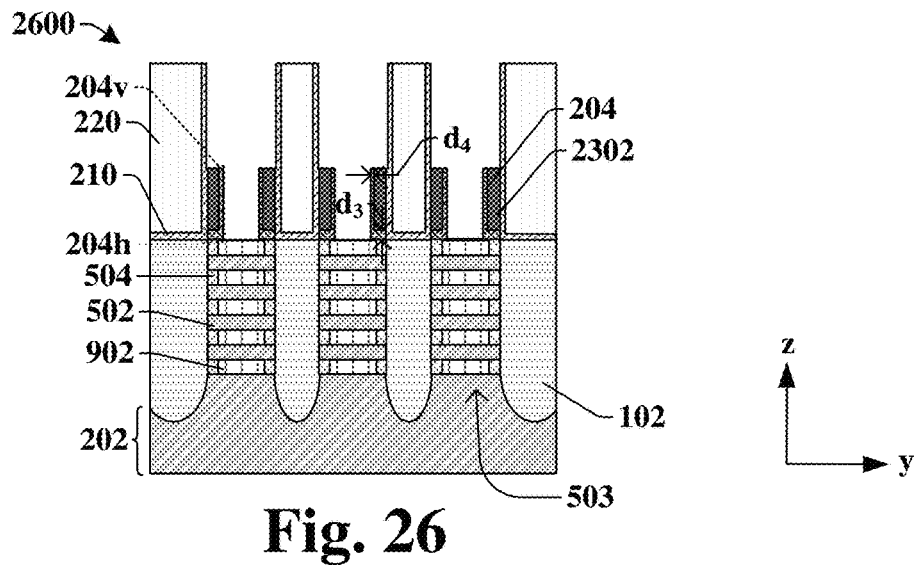

As shown in cross-sectional view 2600 of FIG. 26, a removal process is conducted to remove the dummy gate electrodes (1606 of FIG. 25) from over the nanosheet channel structures 502. Further, in some embodiments, upper portions of the dummy spacer structures 2302 and upper portions of the first low-k dielectric spacer layers (1802 of FIG. 25) are removed. In some embodiments, the removal process of FIG. 26 comprises a first etchant used to remove the dummy gate electrodes (1606 of FIG. 25) and comprises a second etchant and/or third etchant to remove the upper portions of the dummy spacer structures 2302 and the first low-k dielectric spacer layers (1802 of FIG. 25). Further, in some embodiments, the removal process of FIG. 26 removes the dummy interfacial layer (1603 of FIG. 25) to expose upper ones of the spacer layers 902.

After the removal process of FIG. 26, in some embodiments, remaining lower portions of the first low-k dielectric spacer layers (1802 of FIG. 25) form low-k dielectric spacer structures 204 over the nanosheet channel structures 502. The low-k dielectric spacer structures 204 may exhibit an overall "L-like" shape that comprises a horizontal portion 204$h$ that directly overlies the inner-spacer structures 504 and that comprises a vertical portion 204v protruding in the z-direction from the horizontal portion 204h and directly overlying the nanosheet channel structures 502. The removal process of FIG. 26 may reduce a width of the vertical portions 204v of the low-k dielectric spacer structures 204, in some embodiments. Thus, after the removal process of FIG. 26, the horizontal portions 204h of the low-k dielectric spacer structures 204 have a height measured in the z-direction and equal to the third distance $d_3$. In some embodiments, the third distance $d_3$ is in a range of between, for example, approximately 0.1 nanometers and approximately 4 nanometers. Further, after the removal process of FIG. 26, the vertical portions 204v of the low-k dielectric spacer structures 204 have a width measured in the y-direction and equal to a fourth distance $d_4$ that is less than the third distance $d_3$. After the removal process of FIG. 26, the vertical portions 204v of the low-k dielectric spacer structures 204 still extend along sidewalls of the dummy spacer structures 2302.

Figure 27:
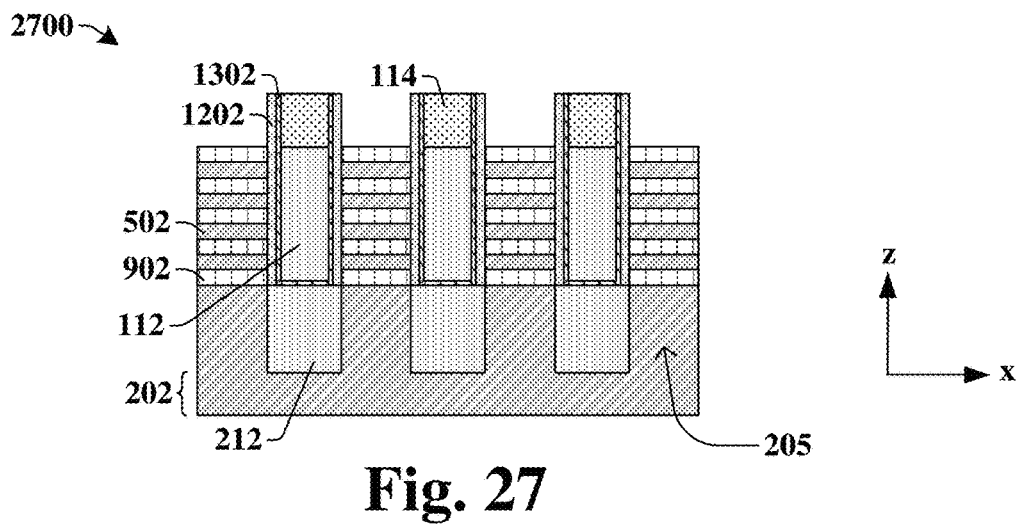

FIG. 27 illustrates a cross-sectional view 2700 of some embodiments of the integrated chip on the xz-plane after the removal process of FIG. 26. Thus, in some embodiments, the cross-sectional view 2700 corresponds to cross-section line BB' of FIG. 22 after the steps of the method illustrated in FIGS. 23-26 have been performed.

As illustrated in the cross-sectional view 2700 of FIG. 27, the high-k dielectric spacer structures 114 are arranged over each of the dielectric fin structures 112. Further, in some embodiments, the high-k dielectric spacer structures 114, the low-k dielectric material 1302, and the conformal semiconductor layer 1202 have upper surfaces that are substantially coplanar with one another. Further, in some embodiments, the high-k dielectric spacer structures 114 have lower surfaces arranged completely over the nano sheet channel structures 502.

Figure 28:
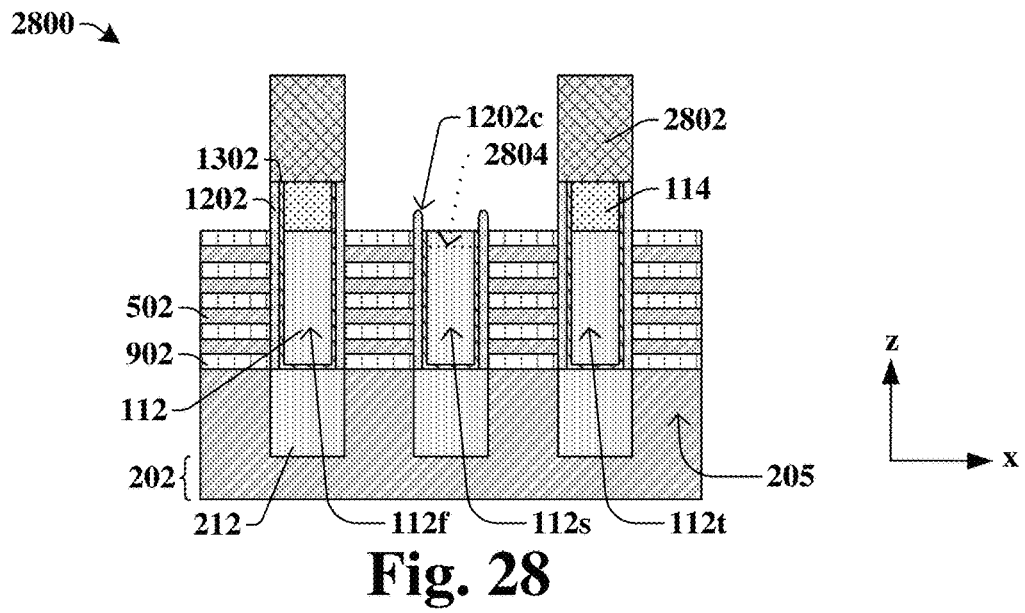

As illustrated in cross-sectional view 2800 of FIG. 28, in some embodiments, one or more of the high-k dielectric spacer structures 114 are selectively removed from the dielectric fin structures 112. For example, in some embodiments, first and third dielectric fin structures 112f, 112t and their surrounding conformal semiconductor layers 1202 and low-k dielectric materials 1302 are covered by second masking structures 2802. The second masking structures 2802 may be formed by way of deposition, photolithography, and removal processes, in some embodiments, and thus, may comprise a hard mask or photoresist material. After the formation of the second masking structures 2802, the high-k dielectric spacer structure 114 may be removed from a second dielectric fin structure 112s. In some embodiments, the high-k dielectric spacer structure 114 may be removed using a dry etchant. As a result, portions of the conformal semiconductor layers 1202 and the low-k dielectric materials 1302 that are uncovered by the second masking structures 2802 may be removed. In some embodiments, as a result, the conformal semiconductor layer 1202 in FIG. 28 arranged around the second dielectric fin structure 112s may comprise upper corners 1202c that are rounded.

Further, in some embodiments, the second dielectric fin structure 112s may remain unchanged by the selective removal of the high-k dielectric spacer structure 114. In other embodiments, upper portions of the second dielectric fin structure 112s may be removed as a result of over-etching by the removal of the high-k dielectric spacer structure 114. In such other embodiments, the second dielectric fin structure 112s that is uncovered by a high-k dielectric spacer structure 114 may have an upper surface (e.g., dotted line 2804) that is below upper surfaces of the first and third dielectric fin structures 112f, 112t that are covered by the high-k dielectric spacer structures 114. Thus, the second dielectric fin structure 112s may have an upper surface that is at about a same height as the first and third dielectric fin structures 112f, 112t as shown in FIG. 28, or the second dielectric fin structure 112s may have an upper surface as illustrated by the dotted line 2804 that is below upper surfaces of the first and third dielectric fin structures 112f, 112t.

Figure 29:
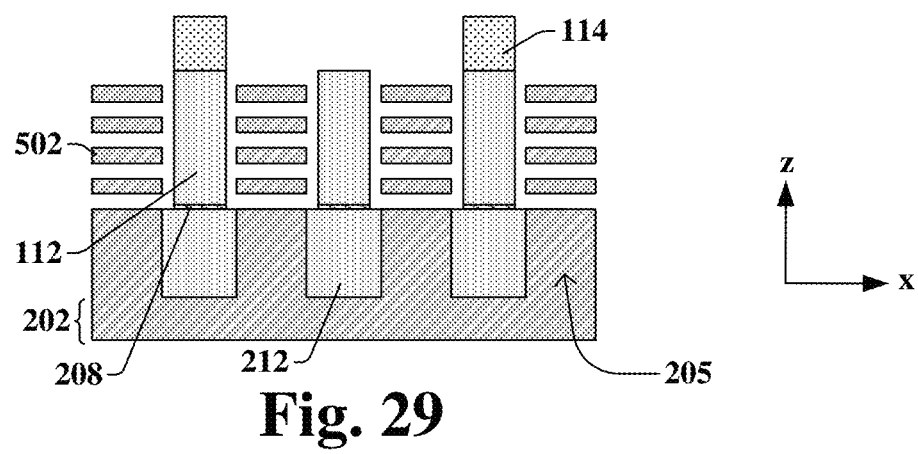

As shown in cross-sectional view 2900 of FIG. 29, a removal process may be performed to completely remove the spacer layers (902 of FIG. 28) and the conformal semiconductor layers 1202. In some embodiments, the removal process of FIG. 29 may also remove portions of the low-k dielectric materials 1302, thereby forming a dielectric fin liner 208 arranged directly between the dielectric fin structures 112 and the lower isolation structures 212. After the removal process of FIG. 29, the nanosheet channels structures 502 are spaced apart from one another in the z-direction and are spaced apart from the dielectric fin structures 112 in the x-direction. In some embodiments, the removal process of FIG. 29 comprises an isotropic etching process.

Figure 30:
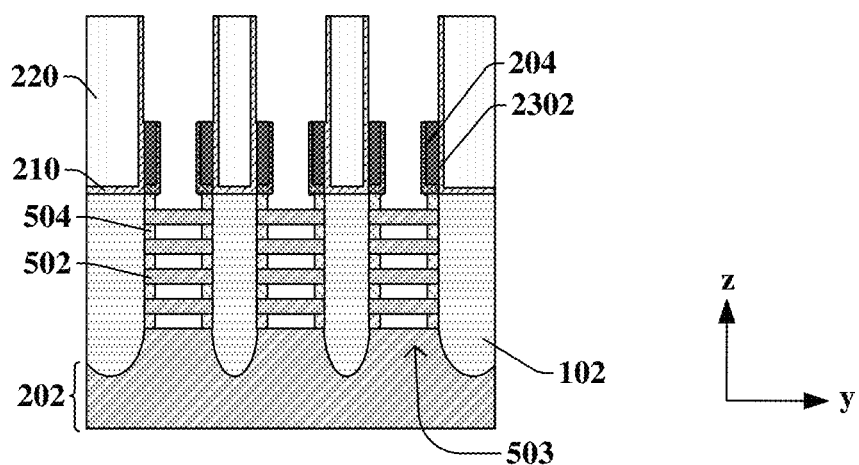

FIG. 30 illustrates a cross-sectional view 3000 of some embodiments of the integrated chip on the yz-plane after the removal process of FIG. 29.

As shown in the cross-sectional view 3000 of FIG. 30, in some embodiments, the removal process of FIG. 29 used to remove the spacer layers (902 of FIG. 26) does not remove the low-k dielectric spacer structures 204 or the inner-spacer structures 504.

Figure 31:
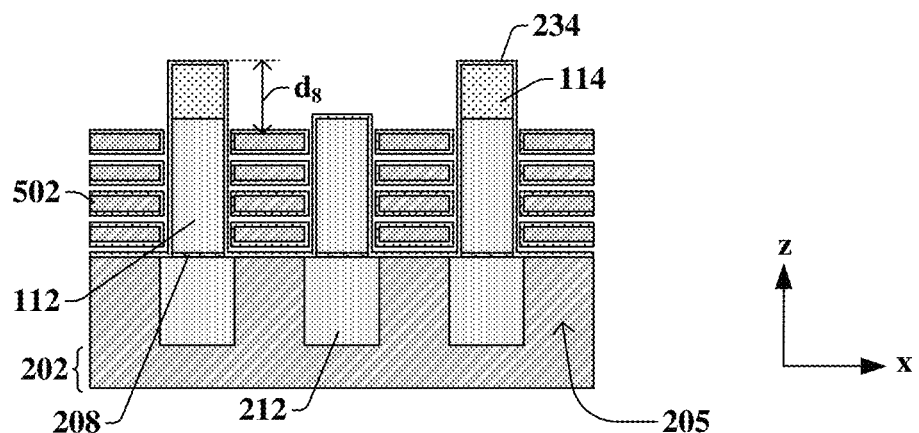

FIG. 31 illustrates a cross-sectional view 3100 of some embodiments of the integrated chip on the xz-plane, wherein a high-k dielectric layer 234 is formed around the nanosheet channel structures 502 and over the dielectric fin structures 112, the sub-semiconductor fins 205, and the high-k dielectric spacer structures 114.

As shown in the cross-sectional view 3100 of FIG. 31, the high-k dielectric layer 234 is a substantially thin layer, and thus, does not completely fill in the spaced between the nanosheet channel structures 502 and/or the dielectric fin structures 112. In some embodiments, the high-k dielectric layer 234 comprises a high-k dielectric material, wherein the dielectric constant is greater than 7, such as, for example, hafnium oxide, zirconium oxide, hafnium aluminum oxide, hafnium silicon oxide, aluminum oxide, or some other suitable high-k dielectric material. The high-k dielectric layer 234 may be formed by way of a deposition process (e.g., CVD, PVD, PE-CVD, ALD, sputtering, etc.). Further, in some embodiments, prior to the formation of the high-k dielectric layer 234, an interfacial layer (not shown) may be formed over the sub-semiconductor fins 205 and around the nanosheet channel structures 502. In some embodiments, the high-k dielectric spacer structures 114 are arranged above the nanosheet channel structures 502 by an eighth distance $d_8$, which may be in a range of between, for example, approximately 8 nanometers and approximately 46 nanometers. In some embodiments, the eighth distance $d_8$ may include the high-k dielectric layer 234 arranged directly over the high-k dielectric spacer structure 114.

Figure 32:
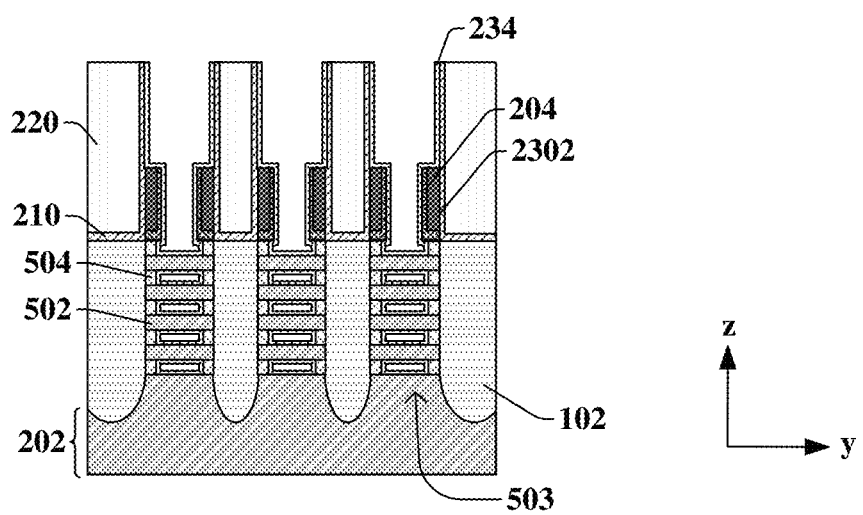

FIG. 32 illustrates a cross-sectional view 3200 of some embodiments of the integrated chip on the yz-plane after the formation of the high-k dielectric layer 234.

As shown in the cross-sectional view 3200 of FIG. 32, in some embodiments, the high-k dielectric layer 234 is a substantially thin layer formed on exposed surfaces of the nanosheet channel structures 502 and the lower semiconductor fin structures 503. The high-k dielectric layer 234 may also be formed on the low-k dielectric spacer structures 204 and along the low-k dielectric layer 210.

Figure 33:
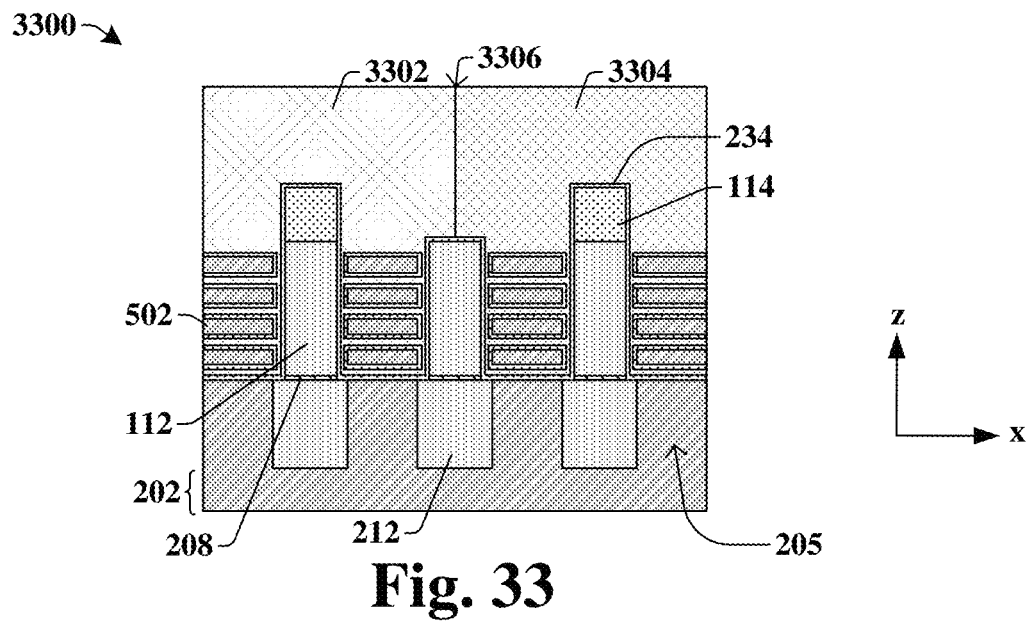

FIG. 33 illustrates a cross-sectional view 3300 of some embodiments of an integrated chip on the xz-plane, wherein a first gate electrode 3302 and a second gate electrode 3304 are formed over and around the nanosheet channel structures 502.

As shown in the cross-sectional view 3300 of FIG. 33, in some embodiments, the first and second gate electrodes 3302, 3304 comprise different materials. In some embodiments, the first and second gate electrodes 3302, 3304 extend above the high-k dielectric spacer structures 114. In other embodiments, a single gate electrode is formed around all of the nanosheet channel structures 502 (e.g., 106 of FIG. 7). In some embodiments, the first and/or second gate electrodes 3302, 3304 comprise a conductive material, such as, for example, titanium, tantalum, aluminum, or some other suitable conductive material. In some embodiments, the first and second gate electrodes are formed by way of a deposition process (e.g., CVD, PVD, PE-CVD, ALD, sputtering, etc.).

In some embodiments, the first gate electrode 3302 may comprise a material associated with a first work function, and the second gate electrode 3304 may comprise a material associated with a second work function. Thus, the NSFETs comprising the nanosheet channel structures 502 surrounded by the first gate electrode 3302 may have a different threshold voltage than the NSFETs comprising the nanosheet channel structures 502 surrounded by the second gate electrode 3304. For example, in some embodiments, NSFETs comprising the first gate electrode 3302 may be, for example, p-type NSFETs, whereas NSFETs comprising the second gate electrode 3304 may be, for example n-type NSFETs. In such embodiments, a boundary 3306 between the first and second gate electrodes 3302, 3304 may be arranged directly over one of the dielectric fin structures 112.

Figure 34:
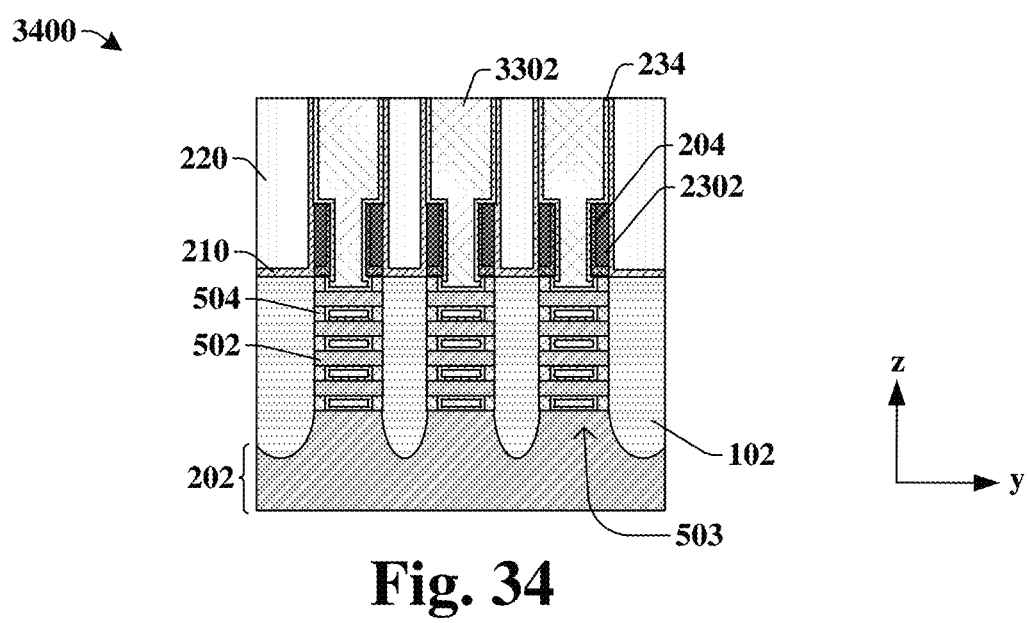

FIG. 34 illustrates a cross-sectional view 3400 of some embodiments of the integrated chip on the yz-plane after the first gate electrode 3302 and the second gate electrode (3304 of FIG. 33) are formed over the substrate 202.

As shown in the cross-sectional view 3400 of FIG. 34, in some embodiments, the first gate electrode 3302, the high-k dielectric layer 234, the upper isolation structure 220, and the low-k dielectric layer 210 have upper surfaces that are substantially coplanar with one another. Thus, in some embodiments, the first gate electrode 3302 may be formed by a deposition process followed by a removal process, such as, for example, a CMP process. Further, the first gate electrode 3302 (and the second gate electrode 3304 of FIG. 33) has upper surfaces arranged over the dummy spacer structures 2302.

Figure 35:
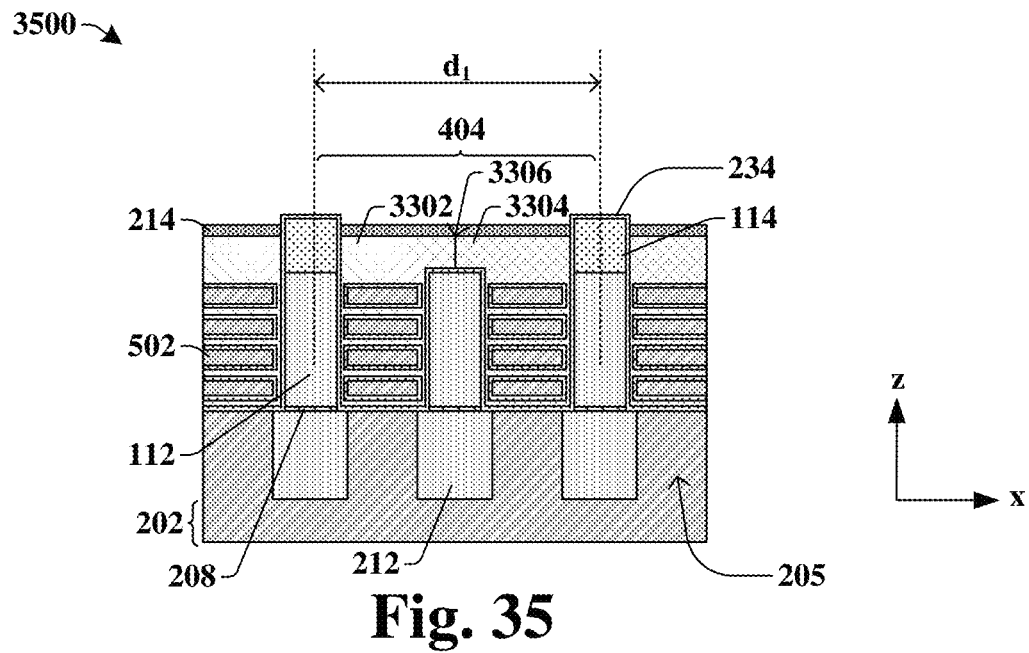

FIG. 35 illustrates a cross-sectional view 3500 of some embodiments of the integrated chip on the xz-plane, wherein a removal process is performed to remove upper portions of the first and second gate electrodes 3302, 3304.

As shown in the cross-sectional view 3500 of FIG. 35, after the removal process of FIG. 35, the first and second gate electrodes 3302, 3304 have upper surfaces arranged below the high-k dielectric spacer structures 114. In some embodiments, the removal process of FIG. 35 comprises an etching process, and in some embodiments, the first and second gate electrodes 3302, 3304 may be removed simultaneously. In some embodiments, after the removal process, an upper conductive layer 214 is formed over the first and second gate electrodes 3302, 3304. The upper conductive layer 214 may comprise a conductive material such as, for example, tungsten, aluminum, titanium, or some other suitable material. In some embodiments, the upper conductive layer 214 is formed by way of a deposition process (e.g., CVD, PVD, PE-CVD, ALD, sputtering, etc.).

The upper conductive layer 214, the first gate electrode 3302, and the second gate electrode 3304 do not extend above the high-k dielectric spacer structures 114, whereas the upper conductive layer 214, the first gate electrode 3302, and the second gate electrode 3304 do extend above the dielectric fin structures 112. Thus, in some embodiments, the high-k dielectric spacer structures 114 may separate and thus, electrically isolate different portions of the first and second gate electrodes 3302, 3304, whereas the high-k dielectric spacer structures 114 may not be present where electrical coupling of the first and second gate electrodes 3302, 3304 is intended. For example, in some embodiments, the first gate electrode 3302 may be intentional coupled to the second gate electrode 3304 at the boundary 3306 arranged directly over the dielectric fin structure 112 that does not include a high-k dielectric spacer structure 114 in order to form a complementary metal oxide semiconductor (CMOS) device 404. In such embodiments, the CMOS device 404 may have a first distance $d_1$ measured in the x-direction in a range of between, for example, approximately 30 nanometers and approximately 80 nanometers. The first distance $d_1$ of the CMOS device 404 is optimized to increase device density on the substrate 202 because the high-k dielectric spacer structures 114 provide electrical isolation between the CMOS device 404 and surrounding NSFET devices.

Figure 36:
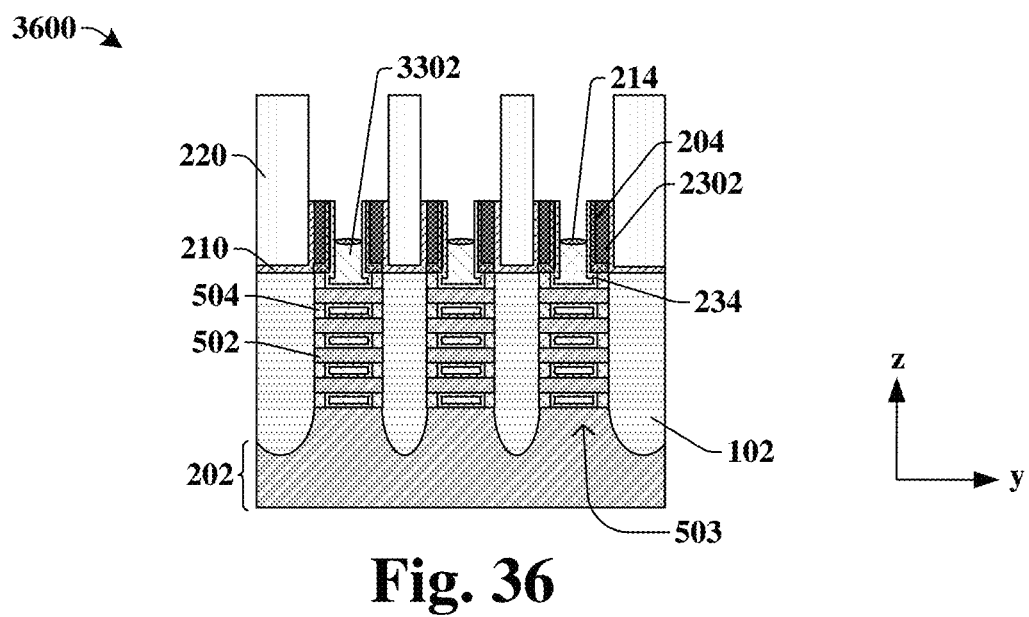

FIG. 36 illustrates a cross-sectional view 3600 of some embodiments of the integrated chip on the yz-plane after the removal process of FIG. 35 and after the formation of the upper conductive layer 214 over the first gate electrode 3302.

As shown in the cross-sectional view 3600 of FIG. 36, in some embodiments, the removal process of FIG. 35 is conducted such that the first gate electrode 3302 has upper surfaces arranged below upper surfaces of the dummy spacer structures 2302. Further, in some embodiments, portions of the high-k dielectric layer 234 and the low-k dielectric layer 210 arranged above the dummy spacer structures 2302 are removed by the removal process of FIG. 35. In some embodiments, the upper isolation structure 220 remains substantially unchanged by the removal process of FIG. 35. In some embodiments, the removal process of FIG. 35 includes a first etching process and a second etching process. In such embodiments, the first etching process may remove portions of the first gate electrode 3302, and the second etching process may follow the first etching process to remove remaining portions of the high-k dielectric layer 234 and the low-k dielectric layer 210. Further, as illustrated in FIG. 36, in some embodiments, the upper conductive layer 214 is formed over the first gate electrodes 3302. The upper conductive layer 214 also does not extend above the dummy spacer structures 2302.

Figure 37A:
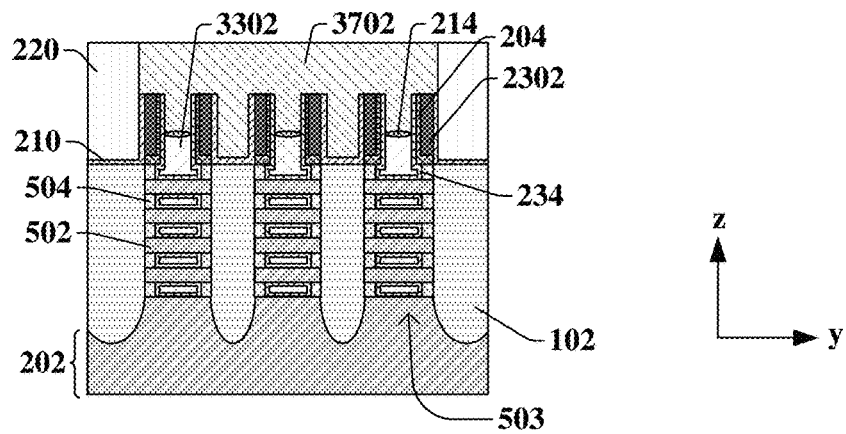

As shown in cross-sectional view 3700A of FIG. 37A, in some embodiments, inner portions of the upper isolation structure 220 may be removed, and a filler material 3702 is formed over the substrate 202 to cover the upper conductive layers 214 and the low-k dielectric layer 210. The filler material 3702 extends above the dummy spacer structures 2302. In some embodiments, the filler material 3702 comprises, for example, silicon oxide, hafnium silicon, silicon oxygen carbide, zirconium silicon, tantalum carbon nitride, silicon nitride, silicon oxygen carbon nitride, silicon, zirconium nitride, or silicon carbon nitride. In some embodiments, the filler material 3702 may be formed by way of a deposition process (e.g., CVD, PVD, PE-CVD, ALD, sputtering, etc.).

Figure 37B:
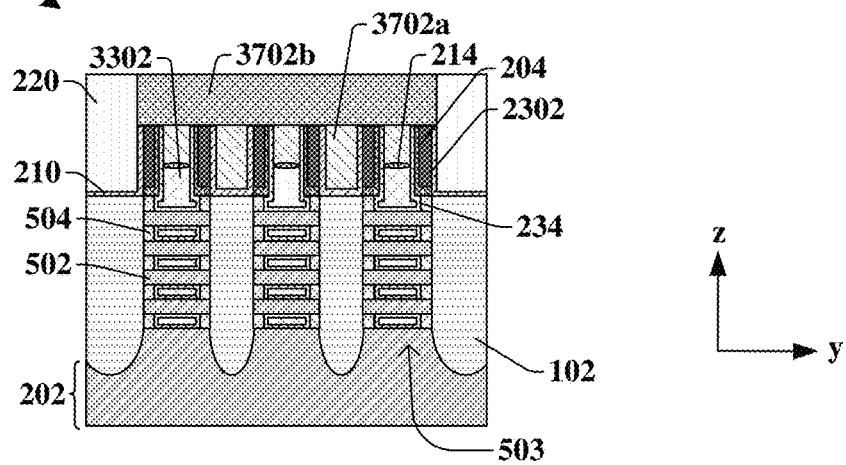

FIG. 37B illustrates a cross-sectional view 3700B of some alternative embodiments of the filler material 3702 of FIG. 37A.

In some embodiments, a first filler material 3702a is formed over the exposed low-k dielectric layers 210 and the upper conductive layer 214 by way of deposition processes and removal processes (e.g., etching), and then a second filler material 3702b is formed over the first filler material 3702a. In some embodiments, the first filler material 3702a does not extend above the dummy spacer structures 2302. In such embodiments, the first and second filler materials 3702a, 3702b may comprise different materials. Although using the first and second filler materials 3702a, 3702b may comprise more manufacturing steps than using the filler material 3702 of FIG. 37A, some embodiments utilize more than one filler material (e.g., 3702a, 3702b of FIG. 37B) to aid in etch selectivity in future processing steps.

Figure 38:
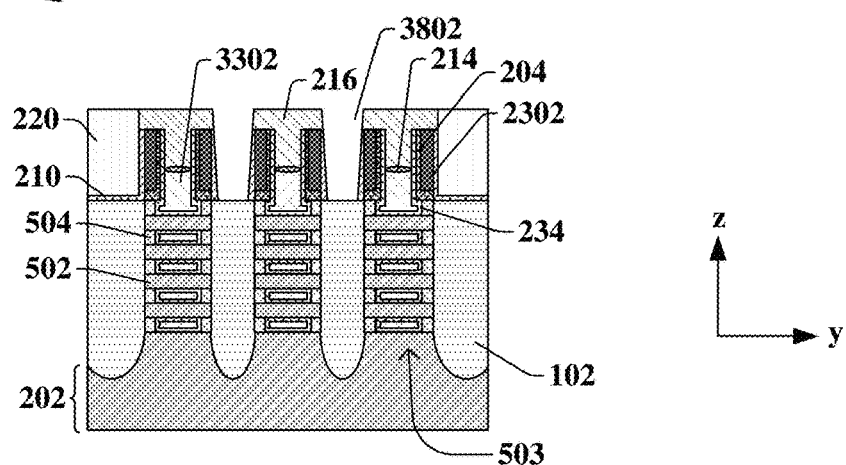

As illustrated in cross-sectional view 3800 of FIG. 38, in some embodiments, the method proceeds from FIG. 37A, metal line cavities 3802 are formed in the filler material (3702 of FIG. 37A) to expose the source/drain regions 102 arranged directly between the first gate electrodes 3302. In some embodiments, the metal line cavities 3802 are formed by way of photolithography and removal (e.g., etching, CMP) processes. Further, the metal line cavities 3802 may extend through the low-k dielectric layer 210. However, in such embodiments, sidewalls of the dummy spacer structures 2302 are still covered by the low-k dielectric layer 210 after the formation of the metal line cavities 3802. Further, in some embodiments, the metal line cavities 3802 extend completely through the filler material (3702 of FIG. 37A) to form filler layers 216 over each first gate electrode 3302.

Figure 39:
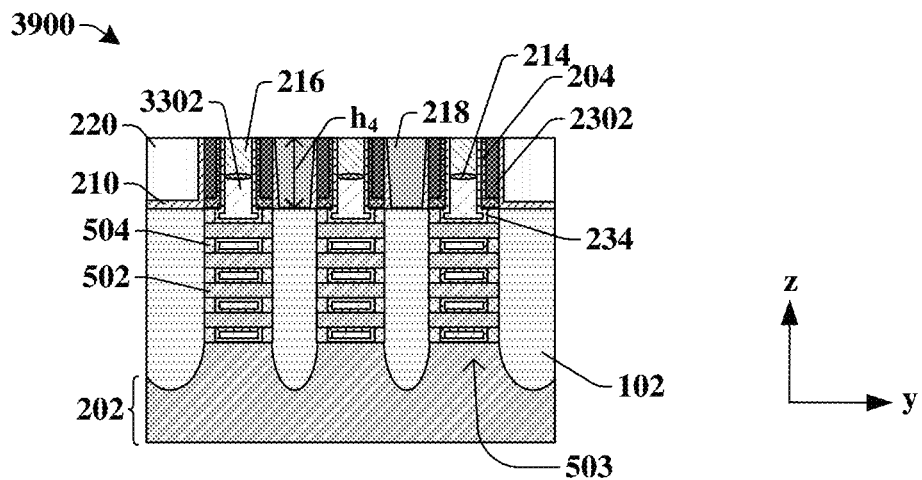

As illustrated in cross-sectional view 3900 of FIG. 39, in some embodiments, metal wires 218 are formed in the metal line cavities (3802 of FIG. 38). The metal wires 218 directly contact the source/drain regions 102. In some embodiments, the metal wires 218 are formed by way of deposition and removal processes. For example, in some embodiments, a conductive material, such as, for example, tungsten, cobalt, ruthenium, copper, titanium, titanium nitride, tantalum, tantalum nitride, molybdenum, nickel, etc. is formed over the upper isolation structure 220 and within the metal line cavities (3802 of FIG. 38), and then a CMP process is performed to remove excess conductive material, thereby forming the metal wires 218. Further, in some embodiments, the CMP process removes portions of the upper isolation structure 220 and the filler layer 216 to expose upper surfaces of the dummy spacer structures 2302. In some embodiments, the metal wires 218 have a fourth height $h_4$ measured in the z-direction and in a range of between, for example, approximately 1 nanometer and approximately 50 nanometers.

Figure 40:
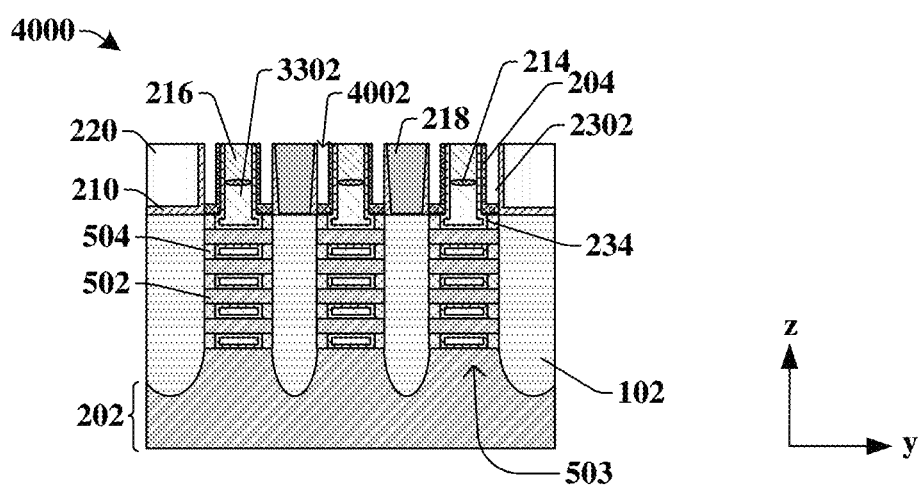

As illustrated in cross-sectional view 4000 of FIG. 40, in some embodiments, the dummy spacer structures (2302 of FIG. 39) are selectively removed. In some embodiments, the dummy spacer structures (2302 of FIG. 39) are removed by an etchant. The removal of dummy spacer structures (2302 of FIG. 39) may be selective because the dummy spacer structures (2302 of FIG. 19) may comprise a different material than surrounding features (e.g., upper isolation structure 220, low-k dielectric spacer structures 204, low-k dielectric layer 2210, high-k dielectric layer 234, filler layer 216, etc.). After the removal of the dummy spacer structures (2302 of FIG. 39), trenches 4002 are formed over the low-k dielectric spacer structures 204 and laterally surrounding the first gate electrodes 3302 in the y-direction. Further, in some embodiments, the low-k dielectric spacer structures 204 act as an etch stop layer such that the inner-spacer structures 504, the nanosheet channel structures 502, and/or source/drain regions 102 are not removed during the removal of the dummy spacer structures (2302 of FIG. 39). In some embodiments, the inner-spacer structures 504, the source/drain regions 102, the nanosheet channel structures 502, and the dummy spacer structures (2302 of FIG. 39) may comprise similar semiconductor materials such as, for example, silicon and/or germanium. Thus, protection of the inner-spacer structures 504, the source/drain regions 102, and the nanosheet channel structures 502 during removal of the dummy spacer structures (2302 of FIG. 39) is achieved by the low-k dielectric spacer structures 204, in some embodiments.

Figure 41:
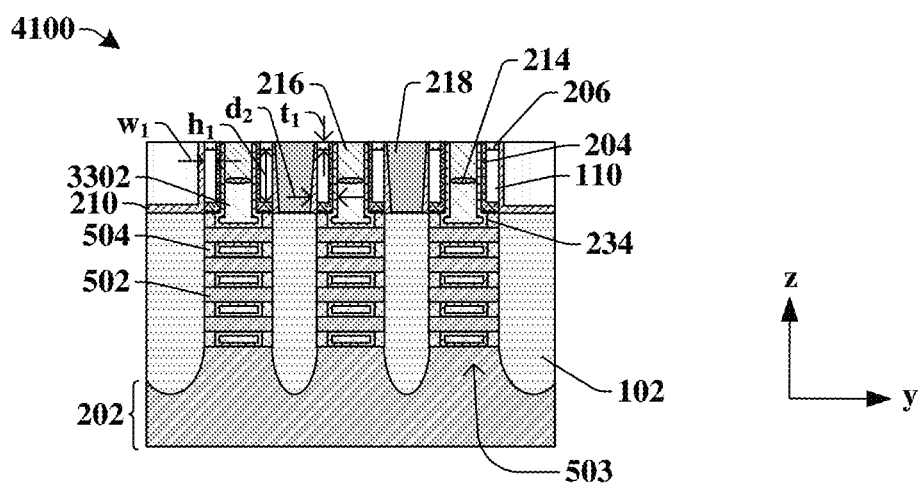

As illustrated in cross-sectional view 4100 of FIG. 41, sealing structures 206 may be formed over the low-k dielectric spacer structures 204 thereby sealing air within the trenches (4002 of FIG. 40) to form air spacer structures 110. In some embodiments, the sealing structures 206 may comprise, for example, a low-k dielectric material, wherein the dielectric constant is less than 7, such as, for example, silicon oxynitride, silicon carbon nitride, silicon oxygen carbide, silicon oxygen carbon nitride, silicon nitride, or some other suitable low-k dielectric material. The sealing structures 206 may be formed by way of a deposition process (e.g., CVD, PVD, ALD, PE-CVD, sputtering, etc.) followed by a removal process (e.g., CMP). In some embodiments, the sealing structure 206 has a first thickness $t_1$ measured in the z-direction. In some embodiments, the first thickness $t_1$ may be in a range of between, for example, approximately 2 nanometers and approximately 10 nanometers.

The air spacer structure 110 has a first height $h_1$ measured in the z-direction and a first width $w_1$ measured in the y-direction. In some embodiments, the first height $h_1$ may be in a range of between, for example, approximately 4 nanometers and approximately 10 nanometers., and the first width $w_1$ may be in a range of between, for example, approximately 0.5 nanometers and approximately 6 nanometers. The air spacer structures 110 mitigate capacitance between the first gate electrodes 3302 and the metal wires 218, thereby allowing for a reduction in a second distance $d_2$ between metal wires 218 and the first gate electrodes 3302 in the y-direction to increase device density over the substrate 202.

Figure 42:
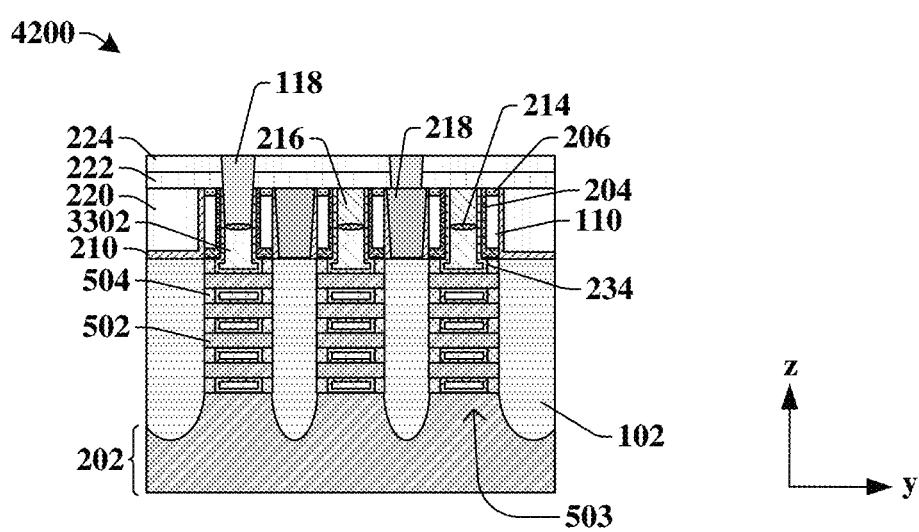

As illustrated in cross-sectional view 4200 of FIG. 42, in some embodiments, a topmost etch stop layer 222 and a topmost isolation layer 224 are formed over the upper isolation structure 220. In some embodiments, the topmost etch stop layer 222 may comprise, for example, a hard mask material, such as silicon nitride. Further, the topmost isolation layer 224 may comprise a dielectric material such as, for example, a nitride (e.g., silicon nitride, silicon oxynitride, silicon oxygen carbon nitride, silicon carbon nitride), a carbide (e.g., silicon carbide, silicon oxygen carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the topmost etch stop layer 222 and the topmost isolation layer 224 may be formed by way of deposition processes (e.g., CVD, PVD, PE-CVD, ALD, sputtering, etc.).

In some embodiments, contact vias 118 may be formed through the topmost etch stop layer 222, the topmost isolation layer 224, and/or the filler layer 216 to contact one or more of the first gate electrodes 3302 and the metal wires 218. The contact vias 118 may each be coupled to control circuitry comprising, for example, gate voltage sources or source/drain voltage sources, for example, in some embodiments. In some embodiments, the contact vias 118 may be formed by way of photolithography, deposition, and removal processes. Because the high-k dielectric layer 234 extends above the first gate electrodes 3302, the air spacer structures 110 and the low-k dielectric spacer structures 204 are protected by the high-k dielectric layer 234 during the formation of the contact vias 118. Further, in some embodiments, the sealing structures 206 are thick enough (e.g., first thickness $t_1$ of FIG. 41) and/or comprise a material with a low etch rate when the contact vias 118 are being formed in order to prevent removal of the sealing structures 206 and exposure of the air spacer structures 110 during the formation of the contact vias 118. If the air spacer structures 110 were to be exposed during the formation of the contact vias 118, the air spacer structures 110 may be filled with the material of the contact vias 118, which may cause electrical shortage between contact vias 118 and other conductive features of the integrated chip. In some embodiments, the contact vias 118 comprise, for example, tungsten, copper, titanium, titanium nitride, tantalum, tantalum nitride, nickel, or some other suitable conductive material. In some embodiments, the air spacer structures 110 also mitigate capacitance between the contact vias 118 and the metal wires 218 such that each NSFET device may be reliably operated.

Figure 43:
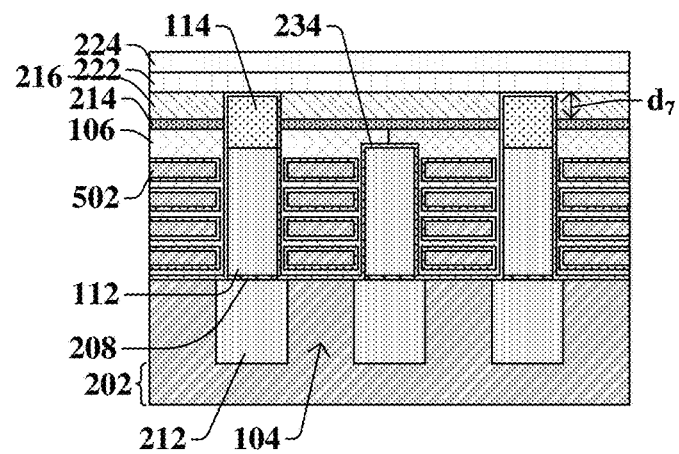

FIG. 43 illustrates a cross-sectional view 4300 of some embodiments on the xz-plane after the formation of the contact vias (118 of FIG. 42).

As illustrated in the cross-sectional view 4300 of FIG. 43, in some embodiments, the filler layer 216 does not extend above the high-k dielectric spacer structures 114 or above the high-k dielectric layer 234. In some embodiments, a thickness of the filler layer 216 measured in the z-direction is equal to a seventh distance $d_7$, which may be in a range of between, for example, approximately 4 nanometers and approximately 26 nanometers. Further, in some embodiments, the high-k dielectric spacer structures 114 extend above the upper conductive layer 214 by the seventh distance $d_7$.

Figure 44:
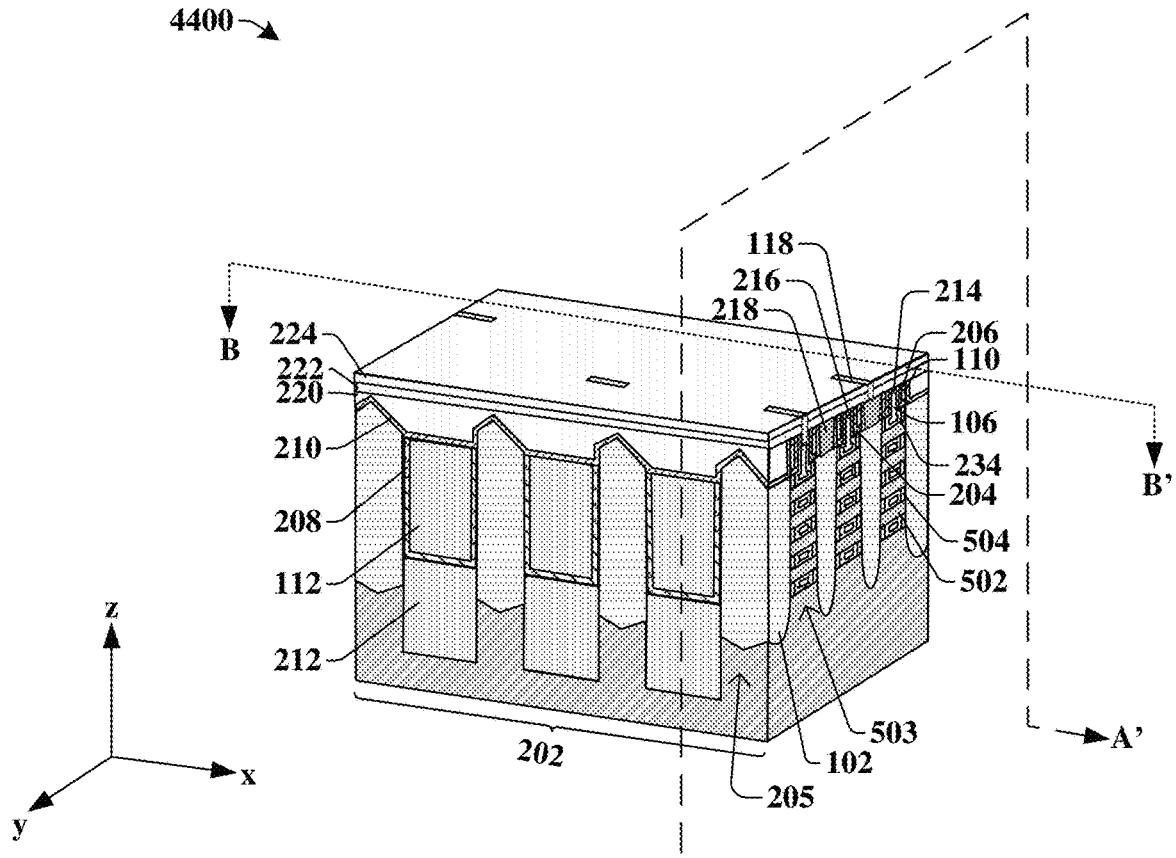

FIG. 44 illustrates a perspective view 4400 of some embodiments of multiple NSFET devices formed over a substrate 202. In some embodiments, the cross-sectional view 4200 of FIG. 42 corresponds to cross-section line AA' of FIG. 44, and the cross-sectional view 4300 of FIG. 43 corresponds to cross-section line BB' of FIG. 44.

At least because of the air spacer structures 110 and the high-k dielectric spacer structures (114 of FIG. 43), the number of NSFET devices in the perspective view 4400 of FIG. 44 may be increased per area of the substrate 202 while maintaining or improving reliability of the NSFET devices.

Figure 45:
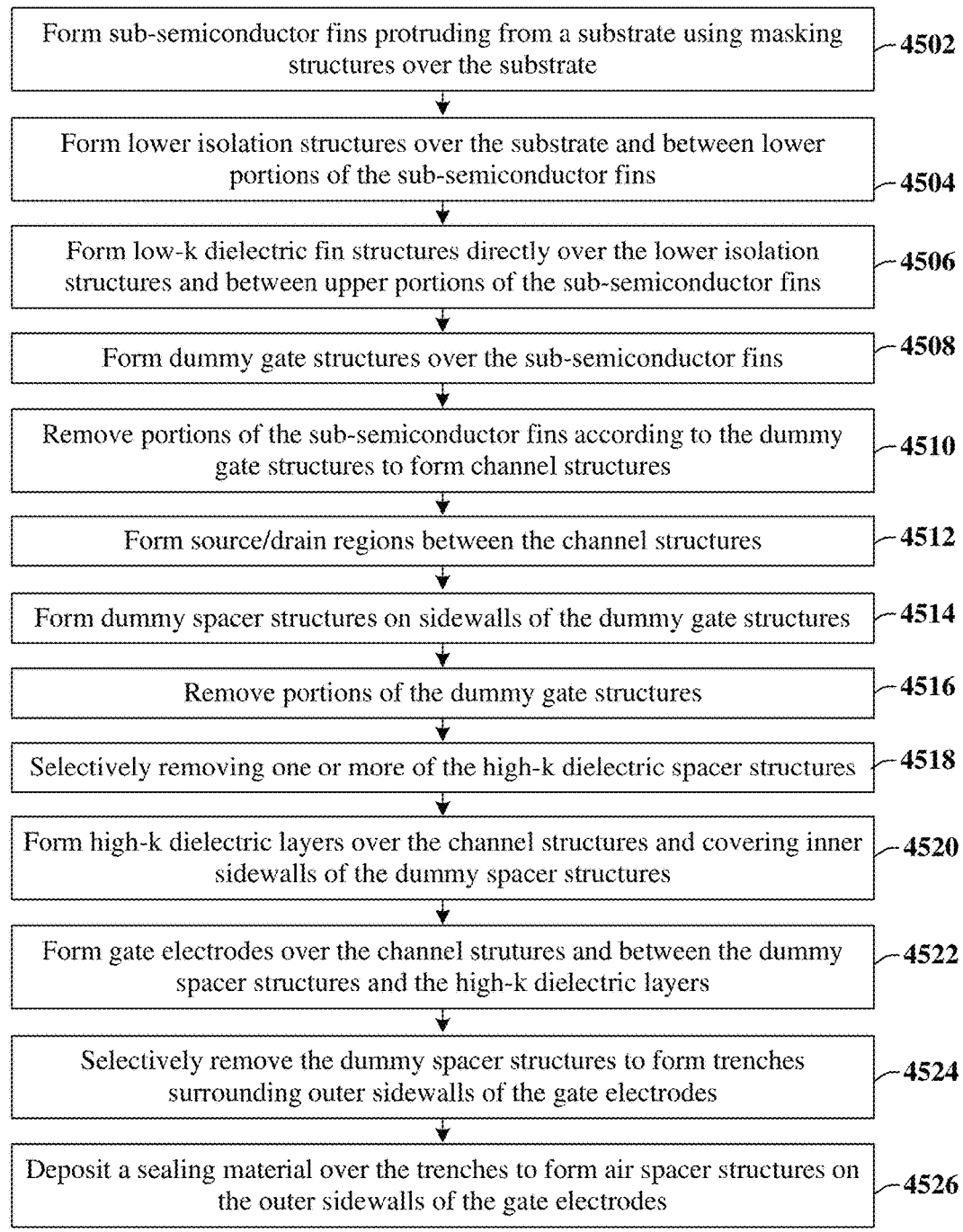
FIG. 45 illustrates a flow diagram of some embodiments of a method corresponding to FIGS. 8-36, 37A, 37B, and 38-44.

FIG. 45 illustrates a flow diagram of some embodiments of a method 4500 of forming an integrated chip having multiple transistor devices with a high device density due to air spacer structures and high-k dielectric spacer structures.

While method 4500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 4502, sub-semiconductor fins are formed that protrude from a substrate using masking structures over the substrate. FIG. 10 illustrates a perspective view 1000 of some embodiments corresponding to act 4502.

At act 4504, lower isolation structures are formed over the substrate and between lower portions of the sub-semiconductor fins. FIG. 11 illustrates a perspective view 1100 of some embodiments corresponding to act 4504.

At act 4506, low-k dielectric fin structures are formed directly over the lower isolation structures and between upper portions of the sub-semiconductor fins. FIG. 13 illustrates a perspective view 1300 of some embodiments corresponding to act 4506.

At act 4508, dummy gate structures are formed over the sub-semiconductor fins. FIG. 16 illustrates a perspective view 1600 of some embodiments corresponding to act 4508.

At act 4510, portions of the sub-semiconductor fins are removed according to the dummy gate structures to form channel structures. FIG. 19 illustrates a cross-sectional view 1900 of some embodiments corresponding to act 4510.

At act 4512, source/drain regions are formed between the channel structures. FIG. 21 illustrates a cross-sectional view 2100 of some embodiments corresponding to act 4512.

At act 4514, dummy spacer structures are formed on sidewalls of the dummy gate structures. FIG. 23 illustrates a cross-sectional view 2300 of some embodiments corresponding to act 4514.

At act 4516, portions of the dummy gate structures are removed. FIG. 26 illustrates a cross-sectional view 2600 of some embodiments corresponding to act 4516.

At act 4518, one or more of the high-k dielectric spacer structures are selectively removed. FIG. 28 illustrates a cross-sectional view 2800 view of some embodiments corresponding to act 4518.

At act 4520, high-k dielectric layers are formed over the channel structures and covering inner sidewalls of the dummy spacer structures. FIG. 32 illustrates a cross-sectional view 3200 of some embodiments corresponding to act 4520.

At act 4522, gate electrodes are formed over the channel structures and between the dummy spacer structures and the high-k dielectric layers. FIG. 36 illustrates a cross-sectional view 3600 of some embodiments corresponding to act 4522.

At act 4524, the dummy spacer structures are selectively removed to form trenches surrounding outer sidewalls of the gate electrodes. FIG. 40 illustrates a cross-sectional view 4000 of some embodiments corresponding to act 4524.

At act 4526, a sealing material is deposited over the trenches to form air spacer structures on the outer sidewalls of the gate electrodes. FIG. 41 illustrates a cross-sectional view 4100 of some embodiments corresponding to act 4526.

Therefore, the present disclosure relates to a method of forming multiple transistors over a substrate, wherein spacing within each transistor device is reduced in a first direction due to air spacer structures and wherein spacing is reduced between devices in a second direction perpendicular to the first direction due to high-k dielectric spacer structures.

Accordingly, in some embodiments, the present disclosure relates to an integrated chip comprising: a first transistor arranged over a substrate and comprising: a first source/drain region and a second source/drain region arranged over the substrate, a first channel structure arranged over the substrate and directly between the first source/drain region and the second source/drain region, a first gate electrode arranged over the first channel structure and between the first source/drain region and the second source/drain region, and a first air spacer structure and a second air spacer structure arranged directly over the first channel structure, wherein the first air spacer structure is spaced apart from the second air spacer structure by the first gate electrode; a second transistor arranged over the substrate and comprising: a third source/drain region and a fourth source/drain region arranged over the substrate, a second channel structure arranged over the substrate and directly between the third source/drain region and the fourth source/drain region, a second gate electrode arranged over the second channel structure and between the third source/drain region and the fourth source/drain region, and a third air spacer structure and a fourth air spacer structure arranged directly over the second channel structure, wherein the third air spacer structure is spaced apart from the fourth air spacer structure by the second gate electrode; a low-k dielectric fin structure arranged over the substrate and directly between the first channel structure and the second channel structure; and a high-k dielectric spacer structure arranged directly over the low-k dielectric fin structure, wherein the high-k dielectric spacer structure separates the first gate electrode from the second gate electrode.

In other embodiments, the present disclosure relates to an integrated chip comprising: a first source/drain region arranged over a substrate; a second source/drain region arranged over the substrate; a channel structure arranged over the substrate and extending between the first source/drain region and the second source/drain region; a gate electrode arranged directly over the channel structure; an first air spacer structure arranged on a first sidewall of the gate electrode and directly over the channel structure; a second air spacer structure arranged on a second sidewall of the gate electrode and directly over the channel structure; and a high-k dielectric layer arranged directly between the gate electrode and the channel structure and arranged directly on outer sidewalls of the gate electrode, wherein topmost surfaces of the high-k dielectric layer are above topmost surfaces of the first and second air spacer structures.

In yet other embodiments, the present disclosure relates to a method comprising: forming sub-semiconductor fins protruding from a substrate using masking structures over the substrate; forming lower isolation structures over the substrate and between lower portions of the sub-semiconductor fins; forming low-k dielectric fin structures directly over the lower isolation structures and between upper portions of the sub-semiconductor fins; forming high-k dielectric spacer structures over the low-k dielectric fin structures and directly between the masking structures; forming dummy gate structures over the sub-semiconductor fins; removing portions of the sub-semiconductor fins according to the dummy gate structures to form channel structures; forming source/drain regions between the channel structures; forming dummy spacer structures on sidewalls of the dummy gate structures; removing portions of the dummy gate structures; selectively removing one or more of the high-k dielectric spacer structures; forming high-k dielectric layers over the channel structures and covering inner sidewalls of the dummy spacer structures; forming gate electrodes over the channel structures and between the dummy spacer structures and the high-k dielectric layers; selectively removing the dummy spacer structures to form trenches surrounding outer sidewalls of the gate electrodes; and depositing a sealing material over the trenches to form air spacer structures on the outer sidewalls of the gate electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a first source/drain region arranged over a substrate;
a second source/drain region arranged over the substrate;
a channel structure arranged over the substrate and between the first source/drain region and the second source/drain region;
a gate electrode arranged directly over the channel structure;
a first air spacer structure arranged on a first sidewall of the gate electrode and directly over the channel structure;
a second air spacer structure arranged on a second sidewall of the gate electrode and directly over the channel structure;
a high-k dielectric layer arranged directly between the gate electrode and the channel structure and arranged directly on outer sidewalls of the gate electrode;
a low-k spacer structure having an L-shaped profile exposed within the first air spacer structure, and further demarcating a bottom boundary and a sidewall boundary of the first air spacer structure, wherein the low-k spacer structure separates the first air spacer structure from the gate electrode;
a pair of dielectric fin structures directly between which the channel structure is arranged; and
a pair of high-k spacer structures respectively atop the pair of dielectric fin structures and directly between which the gate electrode is arranged;
wherein the first and second source/drain regions have individual sidewalls facing away from the gate electrode in a dimension, wherein the pair of dielectric fin structures have a length in the dimension exceeding a separation between the individual sidewalls, and wherein the pair of high-k spacer structures have individual widths in the dimension closer to a width of the gate electrode in the dimension than to the length.

2. The integrated chip of claim 1, wherein the low-k spacer structure comprises a first portion arranged on an outer sidewall of the high-k dielectric layer and laterally between the first air spacer structure and the high-k dielectric layer, and further comprises a second portion arranged vertically between the first air spacer structure and the channel structure, wherein the first portion has a first thickness measured in a first direction, wherein the second portion has a second thickness measured in a second direction perpendicular to the first direction, and wherein the second thickness is greater than the first thickness.

3. The integrated chip of claim 1, further comprising:
a gate contact via arranged between the high-k dielectric layer and electrically coupled to the gate electrode, wherein the gate contact via has a bottommost surface that is below a topmost surface of the high-k dielectric layer.

4. The integrated chip of claim 1, wherein the channel structure is a nanosheet channel structure, and wherein the gate electrode and the high-k dielectric layer are also arranged below the channel structure.

5. The integrated chip of claim 1, wherein the channel structure is a fin structure protruding from the substrate, and wherein the channel structure and the substrate comprise a same semiconductor material.

6. The integrated chip of claim 1, wherein the high-k dielectric layer comprises a dielectric material having a dielectric constant greater than 7.

7. The integrated chip according to claim 1, wherein topmost surfaces of the high-k dielectric layer are above topmost surfaces of the first and second air spacer structures.

8. The integrated chip of claim 1, wherein the individual widths of the high-k spacer structures are about equal to a separation between the first and second source/drain regions.

9. The integrated chip of claim 1, wherein the pair of dielectric fin structures comprise a first dielectric fin structure, wherein the pair of high-k spacer structures comprise a first high-k spacer structure overlying and directly contacting the first dielectric fin structure at an interface, which is closer to an elevation at a topmost surface of the low-k spacer structure than to an elevation at a bottom of the first dielectric fin structure, and wherein the first dielectric fin structure and the first high-k spacer structure share a common width at the interface.

10. An integrated chip comprising:
a first source/drain region arranged over a substrate;
a second source/drain region arranged over the substrate;
a channel structure arranged over the substrate and laterally between the first source/drain region and the second source/drain region in a first dimension;
a gate electrode arranged directly over the channel structure;
a first air spacer structure arranged on a first sidewall of the gate electrode and directly over the channel structure;
a second air spacer structure arranged on a second sidewall of the gate electrode and directly over the channel structure;
a dielectric layer arranged directly between the gate electrode and the channel structure and arranged directly on outer sidewalls of the gate electrode; and
a sealing structure localized to a top of the first air spacer structure and exposed within the first air spacer structure, wherein the sealing structure demarcates a top boundary of the first air spacer structure and has a top surface level with a top surface of the dielectric layer;
wherein the gate electrode has a third sidewall, which faces away from the channel structure laterally in a second dimension orthogonal to the first dimension and which is smooth continuously from a topmost edge of the gate electrode to a location recessed relative to a topmost edge of the channel structure, and wherein the integrated chip is devoid of an air spacer structure arranged on the third sidewall.

11. The integrated chip according to claim 10, wherein the dielectric layer has a higher dielectric constant than the sealing structure.

12. The integrated chip according to claim 10, wherein a bottom surface of the sealing structure is exposed in the first air spacer structure and is completely elevated relative to a top surface of the gate electrode.

13. The integrated chip according to claim 10, further comprising:

a spacer structure having a horizontal segment and a vertical segment both exposed within the first air spacer structure and respectively demarcating a bottom boundary and a sidewall boundary of the first air spacer structure, wherein the spacer structure separates the dielectric layer from the sealing structure.

14. The integrated chip according to claim 10, further comprising:
a first dielectric fin structure and a second dielectric fin structure between which the channel structure is laterally sandwiched; and
a dielectric spacer structure overlying and directly contacting a top surface of the first dielectric fin structure at the third sidewall of the gate electrode;
wherein the gate electrode overlies a top surface of the second dielectric fin structure, and wherein the dielectric spacer structure has a top surface elevated relative to a top surface of the gate electrode.

15. An integrated chip comprising:
a first source/drain region arranged over a substrate;
a second source/drain region arranged over the substrate;
a channel structure arranged over the substrate and between the first source/drain region and the second source/drain region;
a gate electrode arranged directly over the channel structure;
a first air spacer structure arranged on a first sidewall of the gate electrode and directly over the channel structure;
a second air spacer structure arranged on a second sidewall of the gate electrode and directly over the channel structure;
a conductive layer overlying the gate electrode;
a filler layer overlying the conductive layer and being dielectric;
a dielectric layer arranged directly between the gate electrode and the channel structure, and arranged directly on outer sidewalls of the gate electrode, outer sidewalls of the conductive layer, and outer sidewalls of the filler layer, wherein a top surface of the dielectric layer is level with a top surface of the filler layer; and
a spacer structure directly exposed within and demarcating a bottom boundary of the first air spacer structure and further having a top surface level with the top surface of the dielectric layer;
wherein a top boundary of the first air spacer structure is elevated relative to a top surface of the conductive layer.

16. The integrated chip according to claim 15, further comprising:
a conductive contact atop the first source/drain region and having a top surface level with the top surface of the spacer structure.

17. The integrated chip according to claim 15, wherein a height of the first air spacer structure is greater than a height of the gate electrode.

18. The integrated chip according to claim 15, wherein the spacer structure overlies the first source/drain region and completely separates the first air spacer structure from the gate electrode.

19. The integrated chip according to claim 15, wherein the dielectric layer has a U-shaped profile.

20. The integrated chip according to claim 15, further comprising:
a dielectric fin structure elongated in parallel with the channel structure, and arranged on individual sidewalls of the first and second source/drain regions and a sidewall of the channel structure; and a dielectric spacer structure overlying the dielectric fin structure at one of the outer sidewalls of the gate electrode and further extending to an elevation at the top surface of the filler layer from a top surface of the dielectric fin structure, which is recessed relative to a bottom surface of the conductive layer.

* * * * *